United States Patent
Athikessavan et al.

(10) Patent No.: US 11,500,037 B2
(45) Date of Patent: Nov. 15, 2022

(54) METHOD AND A SYSTEM OF DETECTING WINDING FAULT UNDER ONLINE OPERATION OF AN ELECTRICAL MACHINE

(71) Applicants: Sembcorp Industries Ltd, Singapore (SG); National University of Singapore, Singapore (SG)

(72) Inventors: Subash Chandar Athikessavan, Singapore (SG); Shiva Shankaranarayanan Muthuraj, Singapore (SG); Sanjib Kumar Panda, Singapore (SG); Elango Jeyasankar, Singapore (SG); Sai Srinivas Manohar, Singapore (SG)

(73) Assignees: Sembcorp Industries Ltd, Singapore (SG); National University of Singapore, Singapore (SG)

( * ) Notice: Subject to any disclaimer, the term of this patent is extended or adjusted under 35 U.S.C. 154(b) by 0 days.

(21) Appl. No.: 15/734,195

(22) PCT Filed: Aug. 5, 2019

(86) PCT No.: PCT/SG2019/050389
§ 371 (c)(1),
(2) Date: Dec. 1, 2020

(87) PCT Pub. No.: WO2021/025612
PCT Pub. Date: Feb. 11, 2021

(65) Prior Publication Data
US 2022/0155386 A1    May 19, 2022

(51) Int. Cl.
*G01R 31/72*  (2020.01)
*G01R 31/34*  (2020.01)
*G01R 31/52*  (2020.01)

(52) U.S. Cl.
CPC .......... *G01R 31/72* (2020.01); *G01R 31/343* (2013.01); *G01R 31/346* (2013.01); *G01R 31/52* (2020.01)

(58) Field of Classification Search
CPC .... G01R 31/72; G01R 31/343; G01R 31/346; G01R 31/62; H02P 29/024
(Continued)

(56) References Cited

U.S. PATENT DOCUMENTS 5,252,915 A * 10/1993 Sedding ............... G01R 31/343
324/545
6,138,078 A * 10/2000 Canada .................. H02K 11/33
702/56

(Continued)

FOREIGN PATENT DOCUMENTS

AU    2017100471 A4    6/2017
CN    102290790 A1    12/2011
(Continued)

OTHER PUBLICATIONS

Athikessavan et al: "Inter-Turn Fault Detectionof Dry-Type Transformers Using Core-Leakage Fluxes", IEEE Transactions on Power Delivery, IEEE Service Center, New York, NY, US, vol. 34, No. 4, Jul. 24, 2019 (Jul. 24, 2019), pp. 1230-1241, XP011736295, ISSN: 0885-8977, DOI: 10.1109/TPWRD.2018.2878460 [retrieved on Jul. 24, 2019].

(Continued)

*Primary Examiner* — Tung X Nguyen
*Assistant Examiner* — Robert P Alejnikov, Jr.
(74) *Attorney, Agent, or Firm* — Kilpatrick Townsend & Stockton LLP

(57) ABSTRACT

A method and a system of detecting winding fault during online operation of an electrical machine, said method comprising, acquiring a set of signals from the machine over (Continued)

a period, said set of signals comprising two or more magnetic flux signals, each flux signal obtained from a respective flux sensor positioned on the external surface of the machine; extracting an internal winding fault indicator from the set of signals; comparing the internal winding fault indicator with a baseline indicator; and determining the internal winding fault when the internal winding fault indicator deviates from the baseline indicator by a threshold.

19 Claims, 10 Drawing Sheets

(58) Field of Classification Search
USPC ........................................................ 324/546
See application file for complete search history.

(56) References Cited

U.S. PATENT DOCUMENTS

| | | | | |
|---|---|---|---|---|
| 6,144,924 | A * | 11/2000 | Dowling | G01R 31/343 |
| | | | | 702/60 |
| 7,880,473 | B2 * | 2/2011 | Chari | G01R 31/343 |
| | | | | 324/529 |
| 10,514,428 | B2 * | 12/2019 | Williams | G01R 33/0017 |
| 2015/0260794 | A1 * | 9/2015 | Athikessavan | G01R 31/343 |
| | | | | 702/58 |
| 2016/0216334 | A1 * | 7/2016 | Athikessavan | G01R 31/343 |
| 2016/0266208 | A1 * | 9/2016 | Athikessavan | G01R 31/346 |
| 2019/0238077 | A1 * | 8/2019 | Azar | H02P 25/22 |

FOREIGN PATENT DOCUMENTS

| | | |
|---|---|---|
| CN | 106772037 A1 | 5/2017 |
| CN | 109342877 A1 | 2/2019 |
| EP | 0552991 A2 | 7/1993 |

OTHER PUBLICATIONS

European Application No. 19932233.0 received a replacement European Search Opinion, dated Mar. 3, 2022, 7 pages.

Irhoumah M. et al., Detection of Stator Fault in Synchronous Generator Without the Knowledge of the Healthy State. *ELECTRIMAC 2017*, 7 pages, Jul. 6, 2017, [Retrieved on Oct. 8, 2019].

International Application No. PCT/SG2019/050389 received a Written Opinion dated Oct. 17, 2019, 6 pages.

International Application No. PCT/SG2019/050389 received an International Search Report dated Oct. 17, 2109, 4 pages.

* cited by examiner

METHOD AND A SYSTEM OF DETECTING WINDING FAULT UNDER ONLINE OPERATION OF AN ELECTRICAL MACHINE

TECHNICAL FIELD

The present disclosure relates broadly to a method and a system of detecting winding fault under online operation of an electrical machine.

BACKGROUND

Static electrical machines such as transformers are one of the most critical equipment which are widely used in electrical power-generation, -transmission, and -distribution systems. Power-generation systems involve nuclear, thermal, hydro, solar, and wind power plants etc., where the power level is stepped-up by transformers for grid-integration. In power-transmission systems, transformers are used to step-down the AC voltage or convert AC to DC along with power converters. Distribution systems involve power distribution systems of data centres, power plants, commercial premises and various industries such as chemical, paper, pulp, cement etc. Transformers are also used in transit applications for traction power supply and in power distribution systems of marine vessels and other offshore floating facilities. Any catastrophic failure of transformers in above applications may lead to huge economic losses and could endanger the lives of people. Therefore, continuous monitoring of transformers is important to mitigate any unexpected catastrophic failures of transformers which could lead to significant repair-work cost and downtime losses.

A worldwide survey on transformer failures revealed that winding fault is the dominant fault which accounts for 48% of the total transformer failures. Typically, a low-severity winding fault (<3% of total number of winding turns) in a transformer's winding evolves into high-severity fault (>3% of total number of winding turns) which eventually leads to phase-to-ground fault. Therefore, detecting winding fault at a low-severity level can prevent catastrophic ground failure which may lead to substantial core damage and significant downtime for replacement of both core and windings.

Traditionally, sensitive and expensive terminal currents-based technique is used to detect winding fault in high power transformers (>10 MVA). However, implementing expensive terminal currents-based technique for low-power (>5 kVA to <1 MVA) transformers is not economical as the capital cost of existing, sensitive protection systems is higher.

Rotating electrical machines such as Induction Motors (IMs) are the workhorse of modern industries and are another critical piece of equipment which accounts for 80% of all motors used in industrial applications. IMs are widely used in various applications such as electric vehicles, power generation, cranes, elevators, printing machines, rolling (metal work), cooling and ventilation systems, pumps for fluid circulation, marine and train propulsion systems, in industries such as chemical, paper, pulp, cement, textile, packaging etc. Unexpected catastrophic failure of IMs can lead to excessive losses in terms of revenue and/or can endanger lives and goods carried. Therefore, continuous monitoring of IMs is important to mitigate any unexpected catastrophic failures which could lead to significant repair-work cost and downtime losses.

A survey of IM faults carried out by the IEEE-IAS (Institute of Electrical and Electronic Engineers Industry Applications Society), EPRI (Electric Power Research Institute) and Allianz reports that stator winding faults which lead to short-circuit or open-circuit of phase-winding is the second major fault which accounts for 37% of total failures. The inter-turn fault is the most common stator winding fault which eventually leads to catastrophic stator-to-ground failure. Hence, online methods which detect low-severity winding fault can prevent irreversible core damage caused by stator-to-ground failure which increases motor outage time and incurs significant repair-work cost.

Expensive terminal measurements-based techniques are adopted in industries to detect winding fault in Low Voltage (LV) IMs of power rating >45 kW and in Medium Voltage (MV)/High Voltage (HV) IMs. However, basic over-current protection systems are preferred for IMs of power rating <45 kW. This is because the capital cost of existing sensitive winding fault protection systems for IMs is significant w.r.t (with respect to) cost of the equipment itself. Additionally, the existing terminal measurements-based technique for detection of winding fault is insensitive to low-severity faults and cannot differentiate internal winding fault from external line faults.

Existing techniques of winding fault detection in transformers have limitations such as, being limited to detect only high-severity faults or are applicable only under light-load/no-load and offline conditions or require many sensors which lead to complex interconnections or are adopted only for expensive assets.

Existing terminal measurement-based techniques for winding fault detection in rotating IMs are also insensitive to low-severity faults, expensive and are mostly adopted for IMs of power rating >45 kW or MV/LV IMs due to high capital cost of the protection system. Magnetic fluxes-based techniques for detecting winding faults in IMs are required to be invasive in order to achieve high sensitivity, as the non-invasive techniques are influenced by loading conditions of the IMs.

Thus, there is a need for a method and a system of detecting winding fault under online operation of static and rotating electrical machines, which seek to address or at least ameliorate one or more of the above problems.

SUMMARY

According to one aspect, there is provided a method of detecting winding fault during online operation of an electrical machine, said method comprising, acquiring a set of signals from the machine over a period, said set of signals comprising two or more magnetic flux signals, each of said magnetic flux signals obtained from a respective flux sensor positioned on the external surface of the machine; extracting an internal winding fault indicator from the set of signals; comparing the internal winding fault indicator with a baseline indicator; and determining the internal winding fault when the internal winding fault indicator deviates from the baseline indicator by a threshold.

The method may further comprise detecting an external fault prior to the step of extracting the internal fault indicator.

The electrical machine may be a transformer comprising a magnetic core, said magnetic core comprising, a centre limb, a first outer limb positioned on one side of the centre limb and a second outer limb positioned on another opposite side of the centre limb, wherein the three limbs are spaced apart and arranged substantially parallel to one another, each limb having a primary winding and a secondary winding; a top yoke member connected to a respective first end of the centre, first and second outer limbs, a bottom yoke member connected to a respective second end of the centre, first and second outer limbs; the method further comprising energising the transformer, prior to the acquiring of the set of signals; wherein energising the transformer comprises passing a varying electric current through the primary winding to produce varying magnetic fluxes, said varying magnetic fluxes capable of inducing an electro motive force in the secondary winding.

The step of acquiring a set of signals from the transformer over a period may comprise acquiring a first flux signal and a second flux signal, wherein the first flux signal is acquired from a first flux sensor positioned proximate the first outer limb and the second flux signal is acquired from a second flux sensor positioned proximate the second outer limb.

The step of extracting the internal winding fault indicator may comprise acquiring a line-voltage signal of the transformer; summing the first and second flux signals to obtain a total flux signal; obtaining the difference between the phase angle of the line-voltage of the transformer and the phase angle of the total flux signal, as the internal winding fault indicator; or obtaining a combination of (i) the difference between the phase angle of the line-voltage of the transformer and the phase angle of the total flux signal and (ii) a magnitude value of the total flux signal, as the internal winding fault indicator.

The baseline indicator thresholds may be 110%, 115%, 120%, 125%, 130%, 135%, 140%, 145%, 150%, or 155% of the phase angles obtained during initial calibration.

The step of detecting the external fault may comprise extracting an external fault indicator by obtaining a first difference between phase angles of the line-voltage of the transformer and the first flux signal; and obtaining a second difference between phase angles of the line-voltage of the transformer and the second flux signal; wherein the external fault indicator is the absolute value of a difference between the first difference and second difference; and detecting the external fault in the transformer when the external fault indicator is within a faulty range.

The faulty range may be a phase angle value which is more than 0° and less than 90°.

The method may further comprise detecting an inrush current condition to the transformer prior to detecting the external fault in the transformer, wherein detecting the inrush current condition comprises extracting respective first and second magnitude values of second harmonic components of the first and second flux signals; comparing magnitude values of first and second flux signals against respective acceptable magnitude values; and detecting an inrush current condition if the magnitude values of the core-leakage/-linkage flux signals at the first and second outer limbs are greater than the respective acceptable magnitude values.

The acceptable magnitude values may be not more than 140%, not more than 145% or not more than 150% of the magnitudes obtained during initial calibration.

The method may further comprise re-acquiring a new set of signals from the transformer when the inrush current condition is detected.

The electrical machine may be a motor or generator comprising, a stator having a cylindrical frame, the cylindrical frame comprising a plurality of electrically conductive windings arranged therein; a rotor having a cylindrical body concentrically mounted and rotatable within the cylindrical frame of the stator, said rotor having a drive end and a non-drive end; and an elongated shaft member coaxially mounted to the rotor, said shaft member protruding from the rotor at the drive end; the method further comprising energising the motor or generator, prior to the acquiring of the set of signals; wherein energising the motor comprises passing a varying electric current through the windings of the stator to produce varying magnetic fluxes, said varying magnetic fluxes capable of inducing the rotor and shaft member to rotate about their respective axis; and wherein energising the generator comprises driving the rotor and shaft member of the generator to rotate about their respective longitudinal axis to produce varying magnetic fluxes linked with the windings of the stator, said varying magnetic fluxes capable of inducing an electro motive force in the windings of the stator.

The step of acquiring a set of signals from the motor or generator over a period may comprise acquiring a set of P flux signals from P flux sensors positioned proximate the stator along the circumference of its cylindrical frame, such that any two adjacent flux sensors along the circumference of the cylindrical frame has an angular separation of $$\frac{360}{P}$$

degrees with respect to the longitudinal axis of the cylindrical frame, wherein P represents the total number of poles of the motor or generator.

The step of extracting the internal winding fault indicator may comprise summing the set of P flux signals to obtain a total flux signal; and performing a Fourier transform on the total flux signal to obtain a magnitude of the total flux signal as the internal winding fault indicator.

The baseline indicator thresholds may be 120%, 130%, or 140% of the magnitude of the total flux signal obtained during initial calibration.

The step of detecting the external fault may comprise performing a Fourier transform on each of the P flux signals to obtain respective magnitudes of the P flux signals; summing the respective magnitudes of the P flux signals to obtain a summed value as an external fault indicator; and detecting the external fault in the motor or generator when the summed value is within acceptable threshold.

The acceptable threshold may be 90%, 85%, or 80% of a baseline load indicator of a lowest loading condition, said baseline load indicator obtained during an initial calibration.

The baseline load indicator may be obtained based on a sum of the respective magnitudes of the P flux signals, or either one of a phase current magnitude or line-current magnitude of the motor or generator, obtained during the initial calibration.

The method may, prior to the detecting an external fault, comprise identifying a loading condition by comparing the summed magnitudes of P flux signals or phase-current magnitude or line-current magnitude with corresponding pre-calibrated values.

The method may further comprise triggering a trip signal when the internal winding fault is detected.

The two or more flux sensors may be either Hall-effect based flux sensors or passive coils.

The method may further comprise acquiring flux signals for at least one fundamental cycle of the flux signals.

According to another aspect, there is provided a system for detecting winding fault during online operation of an electrical machine, said system comprising, a power supply unit, a receiver unit for receiving a set of signals acquired from the machine over a period, said set of signals comprising two or more magnetic flux signals, each of said magnetic flux signals obtained from a respective flux sensor positioned on the external surface of the machine; a signal pre-processing unit for pre-processing the set of signals; and a DSP or FPGA or microcontroller or microprocessor for extracting an internal winding fault indicator from the set of signals, comparing the internal winding fault indicator with a baseline indicator, and determining the internal winding fault when the internal winding fault indicator deviates from the baseline indicator by a threshold.

According to another aspect, there is provided a non-transitory computer readable storage medium having stored thereon instructions for instructing a processing unit of a system to execute a method of detecting winding fault during online operation of an electrical machine, said method comprising, acquiring a set of signals from the machine over a period, said set of signals comprising two or more magnetic flux signals, each of said magnetic flux signals obtained from a respective flux sensor positioned on the external surface of the machine; extracting an internal winding fault indicator from the set of signals; comparing the internal winding fault indicator with a baseline indicator; and determining the internal winding fault when the internal winding fault indicator deviates from the baseline indicator by a threshold.

BRIEF DESCRIPTION OF THE DRAWINGS

Example embodiments of the invention will be better understood and readily apparent to one of ordinary skill in the art from the following written description, by way of example only, and in conjunction with the drawings, in which.

DETAILED DESCRIPTION

Example, non-limiting embodiments may provide a method and a system of detecting winding fault during/under online operation of an electrical machine.

Figure 1:
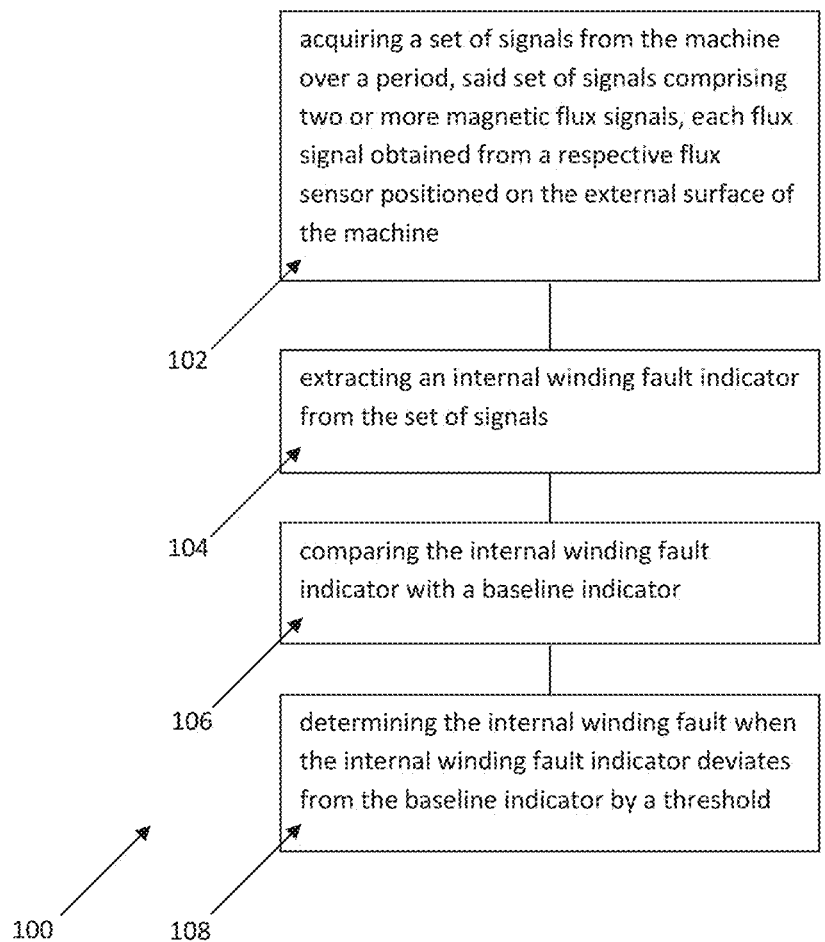
FIG. 1 is a schematic flowchart for illustrating a method of detecting winding fault during online operation of an electrical machine in an example embodiment.

FIG. 1 is a schematic flowchart 100 for illustrating a method of detecting winding fault during online operation of an electrical machine in an example embodiment. The term "electrical machine" as used herein refers to machines which convert energy from one form to another, e.g. mechanical energy into electrical energy or vice versa. Electrical machines may include but are not limited to motors (which converts electricity to mechanical power), generators (which converts mechanical power to electricity) and transformers (which converts alternating current (AC) from one voltage level to another voltage level) and the like. The electrical machine comprises at least a first electrically conductive member for receiving power and at least a second electrically conductive member or at least one permanent magnet for electromagnetic or electromechanical energy conversion.

At step 102, a set of signals is acquired from the machine over a period. The set of signals comprises two or more magnetic flux signals. Each flux signal is obtained from a respective flux sensor positioned on the external surface of the machine. At step 104, an internal winding fault indicator is extracted from the set of signals. At step 106, the internal winding fault indicator is compared with a baseline indicator. At step 108, the internal winding fault is determined when the internal winding fault indicator deviates from the baseline indicator by a threshold.

The method of detecting winding fault during online operation of the electrical machine may further comprise a step of positioning two or more flux sensors on the external surface of the machine, prior to acquiring the set of signals from the machine over a period. External surfaces of the machine may include surfaces such as the outer/exterior aspects of the machine or exposed surfaces which include but are not limited to the outer/exterior aspects of the machine. The external surfaces of the machine are accessible from outside of the machine without having to dismantle the machine. In one example, an external surface of a machine, e.g. a transformer, may refer to the external surface of a yoke member of the transformer. In another example, an external surface of a machine, e.g. an IM, may refer to an end shield of the IM. By positioning two or more flux sensors on the external surface of the machine, the method may be performed while the machine is operating online. That is, the method may be performed without taking the machine offline e.g. disconnecting the machine from a power system network. In addition, by positioning two or more flux sensors on the external surface of the machine, the method may be performed in a non-invasive manner, i.e. without substantially dismantling the machine e.g. dismantling of primary and secondary windings of a transformer or stator and rotor of a motor or generator.

The method may be used to detect a low severity winding fault. A low severity winding fault is defined as not more than 1%, not more than 2%, or not more than 3% of the total turns in the windings e.g. primary- and/or secondary-winding/stator winding member of an electrical machine.

The electrical machine may be a transformer or a motor or a generator. The transformer may include but is not limited to a dry-type transformer, wet-type transformer, power transformer, laminated core transformer, autotransformer, variable autotransformer, induction regulator, single- or poly-phase transformer, grounding transformer, phase-shifting transformer, variable-frequency transformer, leakage or stray field transformer, resonant transformer, constant voltage transformer, air-core transformer, ferrite core transformer, cast resin transformer, isolating transformer or solid-state transformer. The motor may include but is not limited to an AC motor such as single- or poly-phase asynchronous motor (induction motor), single- or poly-phase synchronous motor, linear-induction or synchronous motor. The generators may include but is not limited to a self- or separately-excited DC generator, single- or poly-phase brushless synchronous generator, single- or poly-phase brushed synchronous generator, single- or poly-phase permanent magnet synchronous generator, turbo-alternator, single- or poly-phase asynchronous generator (induction generators), marine-alternator, salient- or non-salient pole alternator or automotive alternator.

The set of signals acquired from the machine may include but is not limited to leakage/linkage fluxes, line-voltage of the machine, line or phase current of the machine, and combinations thereof. In some example embodiments, the set of signals acquired from the machine is selected from the group consisting of leakage/linkage fluxes, line-voltage of the machine, line or phase current of the machine, and combinations thereof. For example, if the machine is a transformer, the set of signals acquired may include core-leakage/-linkage fluxes at specific positions and any one of the line-voltages of the transformer. For example, if the machine is an IM, the set of signals acquired may include leakage fluxes at specific positions and any one of the phase/line current of the IM. The set of signals may be measured under online operating conditions using sensors which include but are not limited to active Hall-effect based flux sensors or passive coils. It would be appreciated that voltage and current parameters are inherent in most electrical systems and would be understood by a person skilled in the art. Voltage and current measurement may be acquired by the person skilled in the art using suitable methods and apparatus. For example, line-voltages may be sensed by using any of Potential Transformers (PTs), Voltage Transformers (VTs), voltage divider and Hall-effect based voltage sensing machines. Line/phase currents may be sensed using any of Current Transformers (CTs), Rogowski coils, shunt resistors and Hall-effect based current sensing machines.

In the example embodiment, the method of detecting winding fault is performed while the machine is under online operating condition. During online operation, the electrical machine is energised (i.e. switched on or powered on). For example, if the machine is a transformer, the transformer is energised by passing a varying electric current through the first electrically conductive member e.g. primary winding of a transformer to produce varying magnetic fluxes, such that the varying magnetic fluxes is capable of inducing an electro motive force in the second electrically conductive member e.g. secondary winding of a transformer.

For example, if the machine is an IM, the IM is energised by passing a varying electric current through the first electrically conductive member e.g. stator winding of the IM to produce varying magnetic fluxes, such that the varying magnetic fluxes is capable of inducing the rotor (and mounted shaft member) to rotate about their respective longitudinal axis by (i) inducing a current in the second electrically conductive member e.g. rotor winding of the IM, or (ii) locking with the rotor poles of a permanent magnet comprised in the rotor, or (iii) locking with the rotor poles generated by an applied DC voltage to the rotor winding. As a result, conversion of electrical energy to mechanical energy is effected by the IM.

For example, if the machine is a generator, the generator is driven by a prime mover such as an electric motor or turbine or an engine, such that the rotor (and mounted shaft member) rotate about their respective longitudinal axis. A DC voltage is then applied to the second electrically conductive member e.g. rotor winding of the generator, or a permanent magnet rotor comprised in the rotor, such that the varying magnetic fluxes from the second electrically conductive member links with the first electrically conductive member e.g. stator winding of the generator. Thus, the varying magnetic flux produced by the rotation of the rotor and shaft member of the generator is capable of inducing an electro motive force in the windings of the stator. As a result, conversion of mechanical energy to electrical energy is effected by the generator.

Example embodiments of the method may advantageously allow continuous monitoring of the machine for winding abnormalities, even while the machine is operating online. Even more advantageously, the method can be performed with a reduced number of sensors per phase (e.g. two to P sensors, where P is the number of poles of a rotating electrical machine) and which can be easily retrofitted to the external surfaces of an existing machine e.g. transformer or motor or generator without dismantling the machine, thereby providing a non-invasive means to detect winding abnormalities. The reduced number of sensors also advantageously simplifies the method of winding fault detection and obviates the situation of having complex inter-connections between numerous sensors. There is also significant cost savings as the method of detecting winding fault may be carried out using a reduced number of e.g. two to P sensors.

Figure 2A:
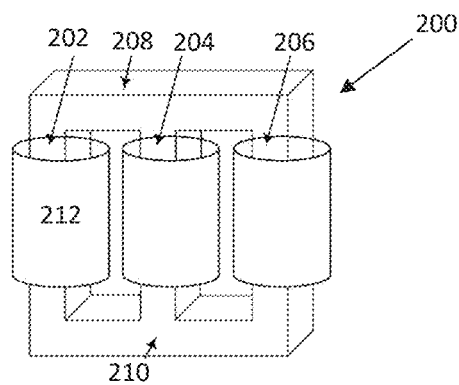
FIG. 2A is a perspective view drawing of a transformer e.g. core-type transformer in an example embodiment.

FIG. 2A is a perspective view drawing of a transformer e.g. core-type transformer 200 in an example embodiment. The core-type transformer 200 comprises a magnetic core having an outer limb-a 202, a centre limb-b 204 spaced adjacent to the outer limb-a 202, an outer limb-c 206 spaced adjacent to the centre limb-b 204. The outer limb-a 202 and outer limb-c 206 are positioned on opposite sides of the centre limb-b 204, and all three limbs 202, 204, 206 are substantially parallel to one another. Each of the three limbs 202, 204, 206 comprises a phase winding e.g. electrically conductive wires 212 applied thereon. The magnetic core of the core-type transformer 200 further comprises a top yoke member 208 coupled to respective top first ends of the outer limb-a 202, centre limb-b 204, and outer limb-c 206, as well as a bottom yoke member 210 coupled to respective bottom second ends of the outer limb-a 202, centre limb-b 204, and outer limb-c 206. The transformer may be a high-power transformer (i.e. having a power rating of at least 1 MVA to 10 MVA) or a low-power transformer (i.e. having a power rating of from about 5 kVA to about 1 MVA).

Figure 2B:
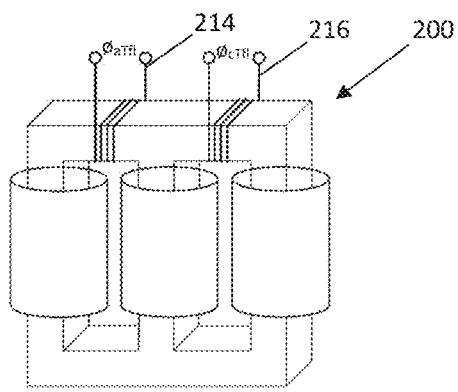
FIG. 2B is a perspective view drawing of the core-type transformer having a pair of sensors e.g. coils positioned at a first set of coil positions in the example embodiment.

FIG. 2B is a perspective view drawing of the core-type transformer 200 having a pair of sensors e.g. coils 214, 216 positioned at a first set of coil positions in the example embodiment. The first coil 214 is configured to acquire/sense/measure/detect signals e.g. linkage flux $\varphi_{aTfl}$ at the outer limb-a 202. The second coil 216 is configured to acquire/sense/measure/detect signals e.g. linkage flux $\varphi_{cTfl}$ at the outer limb-c 206. In the first set of coil positions, the pair of coils 214, 216 are wound around the top yoke member 208 between the centre limb-b 204 and the outer limbs 202 or 206. The first coil 214 is wound around the top yoke member 208 at a portion which is between the outer limb-a 202 and the centre limb-b 204, and the second coil 216 is wound around the top yoke member 208 at a portion which is between the outer limb-c 206 and the centre limb-b 204. $\varphi_{aTfl}$ and $\varphi_{cTfl}$ are the core-leakage/-linkage fluxes measured at limb-a 202 and limb-c 206 of the transformer 200 respectively.

Figure 2C:
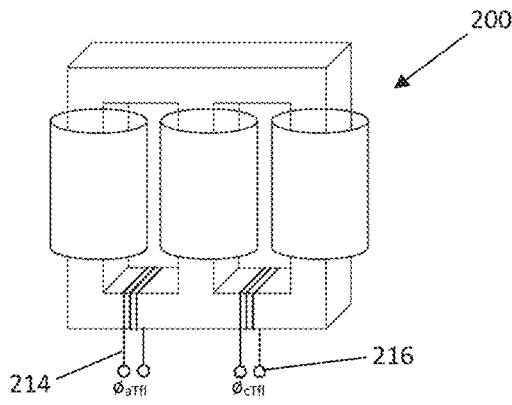
FIG. 2C is a perspective view drawing of the core-type transformer having the pair of sensors e.g. coils positioned at a second set of coil positions in the example embodiment.

FIG. 2C is a perspective view drawing of the core-type transformer 200 having the pair of sensors e.g. coils 214, 216 positioned at a second set of coil positions in the example embodiment. In the second set of coil positions, the pair of coils 214, 216 are wound around the bottom yoke member 210 between the centre limb-b 204 and the outer limbs 202 or 206. The first coil 214 is wound around the bottom yoke member 210 at a portion which is between the outer limb-a 202 and the centre limb-b 204, and the second coil 216 is wound around the bottom yoke member 210 at a portion which is between the outer limb-c 206 and the centre limb-b 204.

Figure 2D:
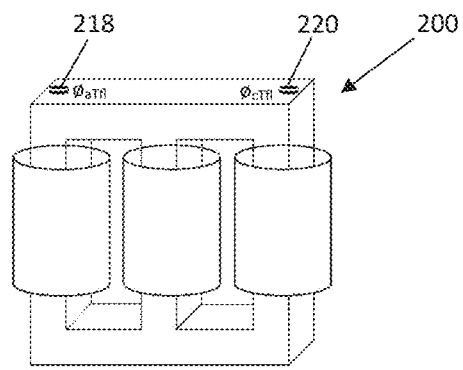
FIG. 2D is a perspective view drawing of the core-type transformer having a pair of sensors e.g. Hall-effect based magnetic flux sensors/coils positioned at a first set of sensor positions in the example embodiment.

FIG. 2D is a perspective view drawing of the core-type transformer 200 having a pair of sensors e.g. Hall-effect based magnetic flux sensors/coils 218, 220 positioned at a first set of sensor positions in the example embodiment. The first Hall-effect based magnetic flux sensor/coil 218 is configured to acquire/sense/measure/detect signals e.g. core-leakage flux $\varphi_{aTfl}$ at the outer limb-a 202. The second Hall-effect based magnetic flux sensor/coil 220 is configured to acquire/sense/measure/detect signals e.g. core-leakage flux $\varphi_{cTfl}$ at the outer limb-c 206. In the first set of sensor positions, the first Hall-effect based magnetic flux sensor/coil 218 is positioned at an edge of the top surface of the top yoke member 208 proximal/near the outer limb-a 202 and the second Hall-effect based magnetic flux sensor/coil 220 is positioned at an edge of the top surface of the top yoke member 208 proximal/near the outer limb-c 206.

For example, the first Hall-effect based magnetic flux sensor/coil 218 is abutted on/in contact with the top yoke member 208 on an exterior surface which overlaps with a region where the first end of the outer limb-a 202 is connected to the top yoke member 208, and the second Hall-effect based magnetic flux sensor/coil 220 is abutted on the top yoke member 208 on an exterior surface which overlaps with a region where the first end of the outer limb-c 206 is connected to the top yoke member 208.

It would be appreciated that a similar configuration of sensor placement may be implemented on the bottom yoke member 210. For example, the first Hall-effect based magnetic flux sensor/coil 218 may be abutted on the bottom yoke member 208 on an exterior surface which overlaps with a region where the second end of the outer limb-a 202 is connected to the bottom yoke member 210, and the second Hall-effect based magnetic flux sensor/coil 220 may be abutted on the bottom yoke member 210 on an exterior surface which overlaps with a region where the second end of the outer limb-c 206 is connected to the bottom yoke member 210.

Figure 2E:
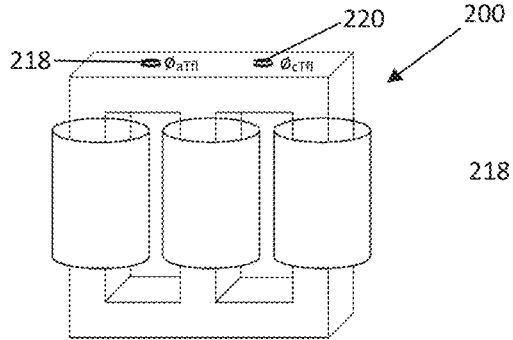
FIG. 2E is a perspective view drawing of the core-type transformer having the pair of Hall-effect based magnetic flux sensors/coils positioned at a second set of sensor positions in the example embodiment.

FIG. 2E is a perspective view drawing of the core-type transformer 200 having the pair of Hall-effect based magnetic flux sensors/coils 218, 220 positioned at a second set of sensor positions in the example embodiment. In the second set of sensor positions, the first Hall-effect based magnetic flux sensor/coil 218 is positioned at the top exterior surface of the top yoke member 208 between the outer limb-a 202 and the centre limb-b 204, and the second Hall-effect based magnetic flux sensor/coil 220 is positioned at the top exterior surface of the top yoke member 208 between the outer limb-c 206 and the centre limb-b 204. It will be appreciated that exterior surfaces are surfaces of the yoke members which are away from the windings, not covered by windings.

For example, the first Hall-effect based magnetic flux sensor/coil 218 is abutted on an exterior surface of the top yoke member 208 at a portion which is between the outer limb-a 202 and the centre limb-b 204, and the second Hall-effect based magnetic flux sensor/coil 220 is abutted on the exterior surface of the top yoke member 208 at a portion which is between the outer limb-c 206 and the centre limb-b 204.

It would be appreciated that a similar configuration of sensor placement may be implemented on the bottom yoke member 210. For example, the first Hall-effect based magnetic flux sensor/coil 218 may be abutted on an exterior surface of the bottom yoke member 210 at a portion which is between the outer limb-a 202 and the centre limb-b 204, and the second Hall-effect based magnetic flux sensor/coil 220 may be abutted on the exterior surface of the bottom yoke member 210 at a portion which is between the outer limb-c 206 and the centre limb-b 204.

Figure 2F:
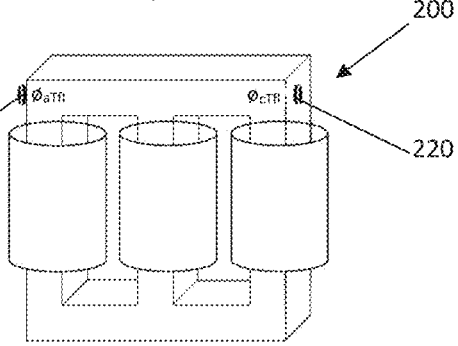
FIG. 2F is a perspective view drawing of the core-type transformer having the pair of Hall-effect based magnetic flux sensors/coils positioned at a third set of sensor positions in the example embodiment.

FIG. 2F is a perspective view drawing of the core-type transformer 200 having the pair of Hall-effect based magnetic flux sensors/coils 218, 220 positioned at a third set of sensor positions in the example embodiment. In the third set of positions, the first Hall-effect based magnetic flux sensor/coil 218 is positioned at the side of outer limb-a 202 near the edge of the top yoke member 208, and the second Hall-effect based magnetic flux sensor/coil 220 is positioned at the side of outer limb-c 206 near the edge of the top yoke member 208. It will be appreciated that the position of the sensors 218 and 220 are positioned on exterior surfaces of the transformer, not covered by the windings.

For example, the first Hall-effect based magnetic flux sensor/coil 218 is abutted on an exterior surface which is proximal to the top yoke member 208 and is substantially parallel to the longitudinal axis of the outer limb-a 202, and the second Hall-effect based magnetic flux sensor/coil 220 is abutted on an exterior surface which is proximal to the top yoke member 208 and is substantially parallel to the longitudinal axis of the outer limb-c 206.

Figure 2G:
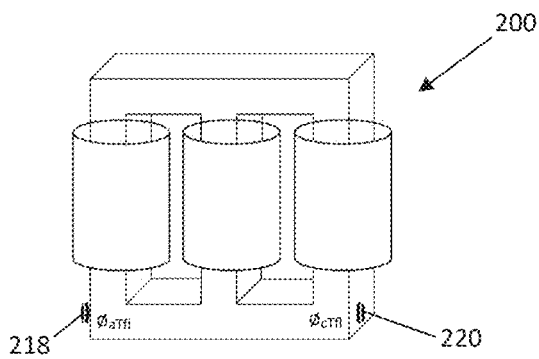
FIG. 2G is a perspective view drawing of the core-type transformer having the pair of Hall-effect based magnetic flux sensors/coils positioned at a fourth set of sensor positions in the example embodiment.

FIG. 2G is a perspective view drawing of the core-type transformer 200 having the pair of Hall-effect based magnetic flux sensors/coils 218, 220 positioned at a fourth set of sensor positions in the example embodiment. In the fourth set of positions, the first Hall-effect based magnetic flux sensor/coil 218 is positioned at the side of outer limb-a 202 near the edge of the bottom yoke member 210, and the second Hall-effect based magnetic flux sensor/coil 220 is positioned at the side of outer limb-c 206 near the edge of the bottom yoke member 210.

For example, the first Hall-effect based magnetic flux sensor/coil 218 is abutted on an exterior surface which is proximal to the bottom yoke member 210 and is substantially parallel to the longitudinal axis of the outer limb-a 202, and the second Hall-effect based magnetic flux sensor/coil 220 is abutted on an exterior surface which is proximal to the bottom yoke member 210 and is substantially parallel to the longitudinal axis of the outer limb-c 206.

It would also be appreciated that in the various sets of positions of the sensors e.g. 214 and 216 or 218 and 220, the first sensor e.g. 214 or 218 is positioned proximate (i.e. near or at) the outer limb-a 202 and the second sensor e.g. 216 or 220 is positioned proximate the outer limb-c 206, and on exterior surfaces of respective limbs. The position of the first sensor e.g. 214 or 218 proximate the outer limb-a 202 may be a mirror image reflection of the second sensor e.g. 216 or 220 proximate the outer limb-c 206 about the centre limb-b 204. In other words, the first sensor e.g. 214 or 218 and second sensor e.g. 216 or 220 are positioned on exterior surfaces of respective outer limbs such that they are mirrored about the centre limb-b 204.

Additional information on the implementation of the winding fault detection methodology as disclosed herein can be found in "Athikessavan, S. C., Jeyasankar, E., Manohar, S. S., & Panda, S. K. (2018). "Inter-turn Fault Detection of Dry-type Transformers using Core-leakage Fluxes". IEEE Transactions on Power Delivery, 1-1", which is incorporated herein by reference.

Figure 3:
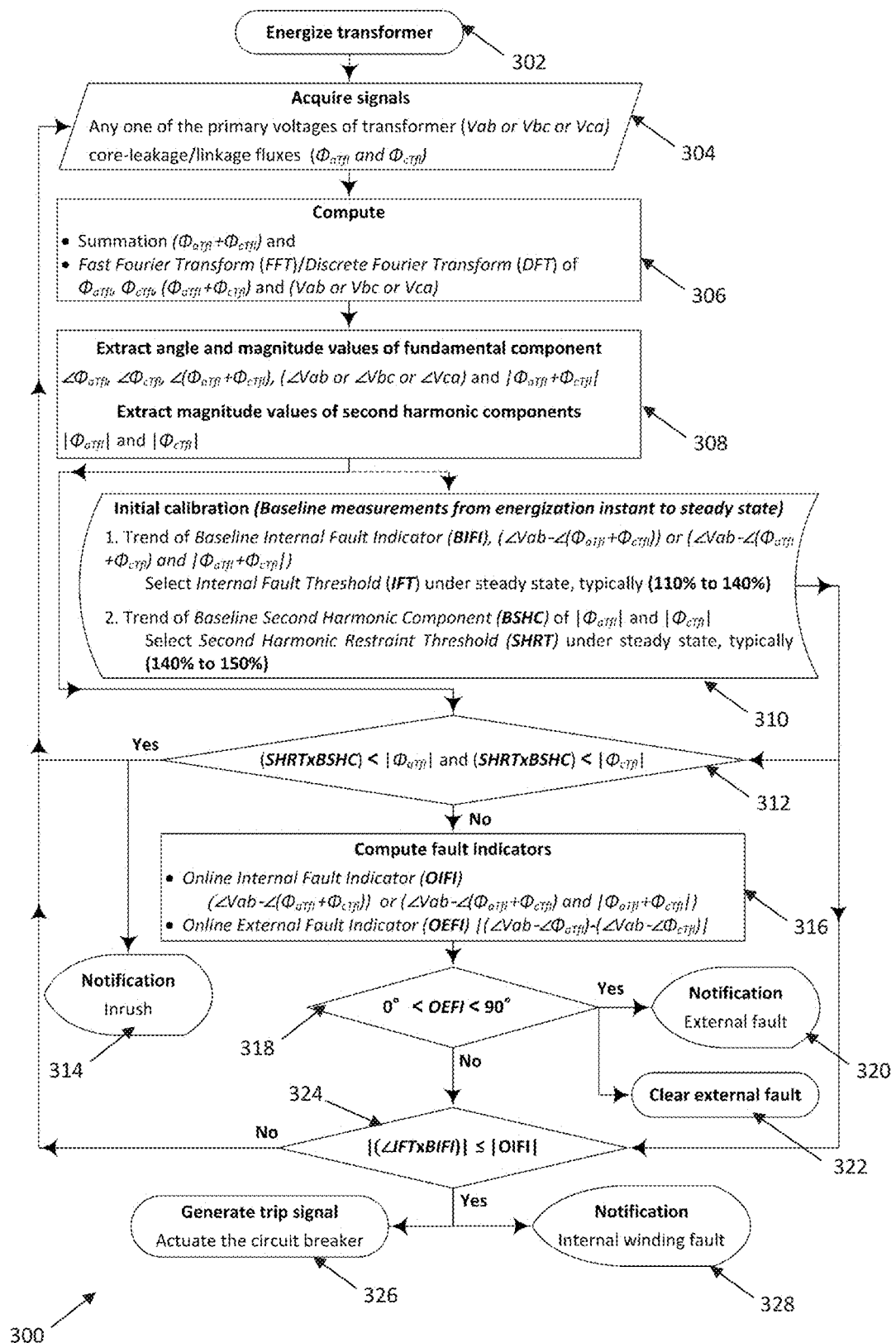
FIG. 3 is a schematic flowchart illustrating a method of detecting winding fault in a transformer in an example embodiment.

FIG. 3 is a schematic flowchart 300 illustrating a method of detecting winding fault in a transformer (compare 200 of FIG. 2) in an example embodiment.

At step 302, the transformer is energised by passing an energising current through the primary winding of the transformer. At step 304, a set of signals is acquired from the transformer, said set of signals comprising any one of the primary voltages of the transformer ($V_{ab}$ or $V_{bc}$ or $V_{ca}$), and core-leakage/linkage fluxes ($\varphi_{aTfl}$ and $\varphi_{cTfl}$). At step 306, the set of signals is computed to obtain summation of $\varphi_{aTfl}$ and $\varphi_{cTfl}$. Fast Fourier Transform (FFT) or Discrete Fourier Transform (DFT) of $\varphi_{aTfl}$, $\varphi_{cTfl}$, ($\varphi_{aTfl}+\varphi_{cTfl}$) and ($V_{ab}$ or $V_{bc}$ or $V_{ca}$) is also performed in step 306. At step 308, phase angle and magnitude values of fundamental component of $\angle\varphi_{aTfl}$, $\angle\varphi_{cTfl}$, $\angle(\varphi_{aTfl}+\varphi_{cTfl})$, ($\angle V_{ab}$ or $\angle V_{bc}$ or $\angle V_{ca}$) and $|\varphi_{aTfl}+\varphi_{cTfl}|$ are extracted respectively. Magnitude values of second harmonic components of $|\varphi_{aTfl}|$ and $|\varphi_{cTfl}|$ are also extracted in step 308.

At step 310, initial calibration (baseline measurement from energisation instant to steady state) is performed. Initial calibration comprises obtaining a trend of a baseline internal fault indicator (BIFI), where BIFI=$\angle V_{ab}-\angle(\varphi_{aTfl}+\varphi_{cTfl})$ or ($\angle V_{ab}-\angle(\varphi_{aTfl}+\varphi_{cTfl})$ and $|\varphi_{aTfl}+\varphi_{cTfl}|$), and selecting an internal fault threshold (IFT) under steady state, where the IFT is typically 110% to 140% of the BIFI. Initial calibration also comprises obtaining a trend of baseline second harmonic components (BSHC) of $|\varphi_{aTfl}|$ and $|\varphi_{cTfl}|$ and selecting a second harmonic restraint threshold (SHRT) under steady state, where the SHRT is typically 140% to 150% of the BSHC. That is, the baseline internal fault indicator is derived by obtaining the difference between phase angles of the line-voltage of the transformer and a total core-leakage/linkage flux signal of the transformer. The baseline internal fault indicator can also be derived by obtaining the difference between phase angles of the line-voltage and the total core-leakage/linkage flux signal along with magnitude value of the total core-leakage/linkage flux signal of the transformer. That is, the baseline internal fault indicator is derived by a combination of (i) obtaining the difference between phase angles of the line-voltage and the total core-leakage/linkage flux signal and (ii) magnitude value of the total core-leakage/linkage flux signal of the transformer. The total core-leakage/linkage flux signals of the transformer is the summation of core-leakage/linkage flux signals measured at the outer limbs-a and -c during e.g. an initial calibration of the transformer. It would be appreciated that the IFT and SHRT are not limited to the above ranges and may be changed depending on the level of sensitivity required. For example, the IFT may be 110%, 115%, 120%, 125%, 130%, 135%, or 140% of the BIFI. For example, the SHRT may be 140%, 145%, or 150% of the BSHC. It would also be appreciated that the BIFI, IFT, BSHC and SHRT may have been obtained previously and that step 310 may be skipped.

At step 312, magnitude values of second harmonic components of core-leakage/linkage flux signals $|\varphi_{aTfl}|$ and $|\varphi_{cTfl}|$ are compared with respective acceptable magnitude values, where the acceptable magnitude value is not more than a product of the SHRT and the BSHC of $|\varphi_{aTfl}|$ and $|\varphi_{cTfl}|$ obtained during initial calibration. A decision is determined whether (i) the magnitude of second harmonic component of $|\varphi_{aTfl}|$ is greater than the product of SHRT and BSHC of $|\varphi_{aTfl}|$, and (ii) the magnitude of second harmonic component of $|\varphi_{cTfl}|$ is greater than the product of SHRT and BSHC of $|\varphi_{cTfl}|$. If the determination at step 312 is affirmative (i.e. if the magnitude values of the core-leakage/linkage flux signals at the outer limbs-a and -c are greater than the respective acceptable magnitude values), the flowchart 300 proceeds to step 314. At step 314, a notification is triggered to indicate the occurrence of an inrush current condition. The flowchart 300 loops back to step 304 to re-acquire a new set of signals from the transformer when the inrush current condition is detected. An inrush current is a form of over current that occurs during energisation of a transformer and is a large transient current which is caused by part cycle saturation of the magnetic core of the transformer. If the determination at step 312 is negative (i.e. if the magnitude values of the core-leakage/linkage flux signals at the outer limbs-a and -c are less than or equal to the respective acceptable magnitude values), the flowchart 300 proceeds to step 316.

At step 316, fault indicators are computed to obtain an online internal fault indicator (OIFI), where OIFI=$\angle V_{ab}-\angle(\varphi_{aTfl}+\varphi_{cTfl})$ or ($\angle V_{ab}-\angle(\varphi_{aTfl}+\varphi_{cTfl})$ and $|\varphi_{aTfl}+\varphi_{cTfl}|$), and an online external fault indicator (OEFI), where OEFI=$|(\angle V_{ab}-\angle\varphi_{aTfl})-(\angle V_{ab}-\angle\varphi_{cTfl})|$. In other words, the OIFI may be $\angle V_{ab}-\angle(\varphi_{aTfl}+\varphi_{cTfl})$ or a combination of ($\angle V_{ab}-\angle(\varphi_{aTfl}+\varphi_{cTfl})$ and $|\varphi_{aTfl}+\varphi_{cTfl}|$). The OEFI is used to detect and discriminate an external fault (i.e. things/events that happen outside the transformer) from an internal winding fault in the transformer.

At step 318, a decision is determined whether the OEFI is within a faulty range of 0° to 90°. If the determination at step 318 is affirmative (i.e. OEFI is more than 0° and less than 90°), the flowchart 300 proceeds to steps 320 and 322. At step 320, a notification is triggered to indicate the occurrence of an external fault, i.e, a fault that happens outside the transformer. At step 322, the external fault is cleared. If the determination at step 318 is negative (i.e. OEFI is less than or equals to 0°, or more than or equals to 90°), the flowchart 300 proceeds to step 324.

At step 324, a decision is determined whether the absolute value of the OIFI is greater than or equal to the absolute value of the product of IFT and BIFI. If the determination at step 324 is affirmative (i.e. $|(\angle IFT \times BIFI)| \leq |OIFI|$), the flowchart 300 proceeds to steps 326 and 328. At step 326, a trip signal is triggered to indicate the occurrence of an internal winding fault and a circuit breaker is actuated to stop the flow of current in the transformer. At step 328, a notification of internal winding fault is triggered. If the determination at step 324 is negative (i.e. $|(\angle IFT \times BIFI)| > |OIFI|$), the flowchart 300 loops back to step 304 to acquire a new set of signals.

In the example embodiment as illustrated in FIG. 3, an additional capability of eliminating/blocking signals during inrush period is provided to avoid spurious trip signal generation. The inventors have recognised that core-leakage/linkage fluxes are proportional to magnetizing currents applied to a static electrical machine e.g. transformer. Therefore, any anomalies which cause disturbance in the excitation currents may adversely affect the detection of winding faults. Examples of phenomena which lead to disturbances in the excitation currents include Geomagnetically Induced Current (GIC), inrush currents, transients such as occurrence of external fault, clearance of fault and bi-directional power flow due to distributed energy sources. Both GIC and inrush currents generate significant amounts of harmonics due positive/negative saturation and part-cycle saturation respectively.

Therefore, in the example embodiment, harmonic restraint is applied to avoid nuisance tripping due to core saturation. Undesired trip signal generation due to momentary transients such as occurrence of external fault, clearance of fault and bidirectional power flow may also be eliminated by coordination with other backup and external protection systems such as overcurrent and directional overcurrent relays. This may be achieved by checking the trip status of e.g. overcurrent and directional overcurrent relays. For example, as shown in step 312, identification of internal winding fault is performed only if the decision of trip status is "False". It would be appreciated that harmonic restraint and/or coordination from other external protection systems may advantageously improve reliability of the method of winding fault detection.

Figure 4:
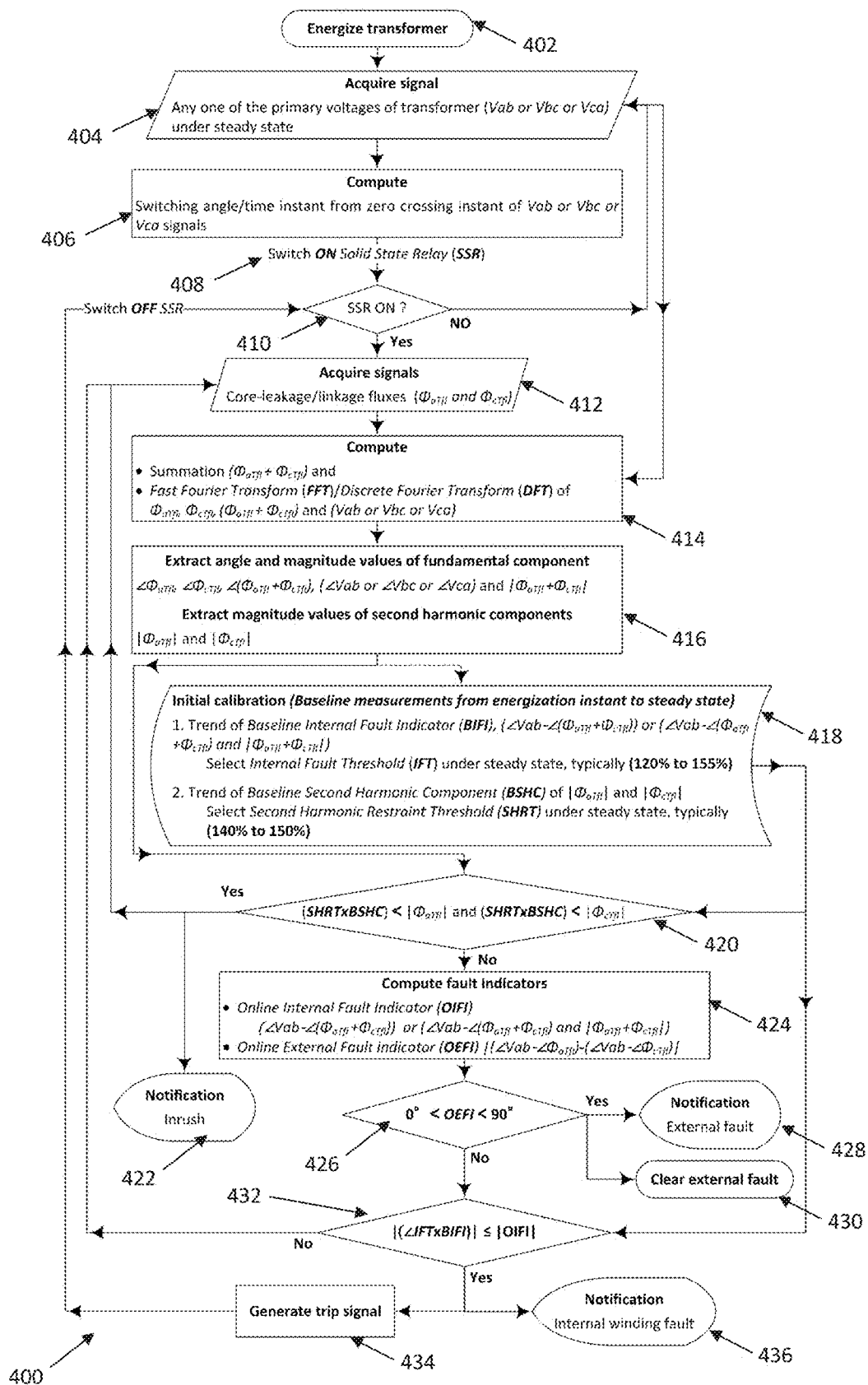
FIG. 4 is a schematic flowchart illustrating a method of detecting winding fault in a transformer in another example embodiment.

FIG. 4 is a schematic flowchart 400 illustrating a method of detecting winding fault in a transformer (compare 200 of FIG. 2) in another example embodiment. At step 402, the transformer is energised by passing energising current through the primary winding of the transformer. At step 404, a first set of signals is acquired from the transformer, said first set of signals comprising any one of the primary voltages of the transformer ($V_{ab}$ or $V_{bc}$ or $V_{ca}$) under steady state. At step 406, switching angle/time instant from zero crossing instant of $V_{ab}$ or $V_{bc}$ or $V_{ca}$ signals is computed. At step 408, solid state relay (SSR) is switched on.

At step 410, a decision is determined whether the SSR is on. If the determination at step 410 is affirmative, the flowchart 400 proceeds to step 412. If the determination at step 410 is negative, the flowchart 400 loops back to step 404 to acquire a new set of signals.

At step 412, a second set of signals is acquired from the transformer, said second set of signals comprising core-leakage/-linkage fluxes ($\varphi_{aTfl}$ and $\varphi_{cTfl}$). At step 414, the second set of signals is computed to obtain summation of $\varphi_{aTfl}$ and $\varphi_{cTfl}$. Fast Fourier Transform (FFT) or Discrete Fourier Transform (DFT) of $\varphi_{aTfl}$, $\varphi_{cTfl}$, ($\varphi_{aTfl}+\varphi_{cTfl}$) and ($V_{ab}$ or $V_{bc}$ or $V_{ca}$) is also performed in step 414. At step 416, phase angle and magnitude values of fundamental component of $\angle\varphi_{aTfl}$, $\angle\varphi_{cTfl}$, $\angle(\varphi_{aTfl}+\varphi_{cTfl})$, ($\angle V_{ab}$ or $\angle V_{bc}$ or $\angle V_{ca}$) and $|\varphi_{aTfl}+\varphi_{cTfl}|$ are extracted respectively. Magnitude values of second harmonic components of $|\varphi_{aTfl}|$ and $|\varphi_{cTfl}|$ are also extracted in step 416.

At step 418, initial calibration (baseline measurement from energisation instant to steady state) is performed. Initial calibration comprises obtaining a trend of a baseline internal fault indicator (BIFI), where BIFI=$\angle V_{ab}-\angle(\varphi_{aTfl}+\varphi_{cTfl})$ or ($\angle V_{ab}-\angle(\varphi_{aTfl}+\varphi_{cTfl})$ and $|\varphi_{aTfl}+\varphi_{cTfl}|$), and selecting an internal fault threshold (IFT) under steady state, where the IFT is typically 120% to 155% of the BIFI. Initial calibration also comprises obtaining a trend of baseline second harmonic components, (BSHC) of $|\varphi_{aTfl}|$ and $|\varphi_{cTfl}|$, and selecting a second harmonic restraint threshold (SHRT) under steady state, where the SHRT is typically 140% to 150% of the BSHC. It would be appreciated that the IFT and SHRT are not limited to the above ranges and may be changed depending on the level of sensitivity required. For example, the IFT may be 120%, 125%, 130%, 135%, 140%, 145%, 150%, or 155% of the BIFI. For example, the SHRT may be 140%, 145%, or 150% of the BSHC. It would also be appreciated that the BIFI, IFT, BSHC and SHRT may have been obtained previously and that step 418 may be skipped.

At step 420, magnitude values of second harmonic components of core-leakage/-linkage flux signals $|\varphi_{aTfl}|$ and $|\varphi_{cTfl}|$ are compared with respective acceptable magnitude values, where the acceptable magnitude value is not more than a product of the SHRT and the BSHC obtained during initial calibration. A decision is determined whether (i) the magnitude of second harmonic component of $|\varphi_{aTfl}|$ is greater than the product of SHRT and BSHC of $|\varphi_{aTfl}|$, and (ii) the magnitude of second harmonic component of $|\varphi_{cTfl}|$ is greater than the product of SHRT and BSHC of $|\varphi_{cTfl}|$. If the determination at step 420 is affirmative (i.e. if the magnitude values of the core-leakage/-linkage flux signals at the outer limbs-a and -c are greater than the respective acceptable magnitude values), the flowchart 400 proceeds to step 422. At step 422, a notification is triggered to indicate the occurrence of an inrush current condition. The flowchart 400 loops back to step 412 to re-acquire a new set of signals from the transformer when the inrush current condition is detected. An inrush current is a form of over current that occurs during energisation of a transformer and is a large transient current which is caused by part cycle saturation of the magnetic core of the transformer. If the determination at step 420 is negative (i.e. if the magnitude values of the core-leakage/-linkage flux signals at the outer limbs-a and -c are less than or equal to the respective acceptable magnitude values), the flowchart 400 proceeds to step 424.

At step 424, fault indicators are computed to obtain an online internal fault indicator (OIFI), where OIFI=$\angle V_{ab}-\angle(\varphi_{aTfl}+\varphi_{cTfl})$ or ($\angle V_{ab}-\angle(\varphi_{aTfl}+\varphi_{cTfl})$ and $|\varphi_{aTfl}+\varphi_{cTfl}|$), and an online external fault indicator (OEFI), where OEFI=|

$(\angle V_{ab}-\angle \varphi_{aTfl})-(\angle V_{ab}-\angle \varphi_{cTfl})|$. In other words, the OIFI may be $\angle V_{ab}-\angle(\varphi_{aTfl}+\varphi_{cTfl})$ or a combination of $(\angle V_{ab}-\angle(\varphi_{aTfl}+\varphi_{cTfl})$ and $|\varphi_{aTfl}+\varphi_{cTfl}|)$. The OEFI is used to detect and discriminate an external fault (i.e. things/events that happen outside the transformer) from an internal winding fault in the transformer.

At step 426, a decision is determined whether the OEFI is within a range of 0° to 90°. If the determination at step 426 is affirmative (i.e. OEFI is more than 0° and less than 90°), the flowchart 400 proceeds to steps 428 and 430. At step 428, a notification is triggered to indicate the occurrence of an external fault, i.e. a fault that happens outside the transformer. At step 430, the external fault is cleared. If the determination at step 426 is negative (i.e. OEFI is less than or equals to 0°, or more than or equals to 90°), the flowchart 400 proceeds to step 432.

At step 432, a decision is determined whether the absolute value of the OIFI is greater than or equal to the absolute value of the product of IFT and BIFI. If the determination at step 432 is affirmative (i.e. $|(\angle IFT \times BIFI)| \leq |OIFI|$), the flowchart 400 proceeds to steps 434 and 436. At step 434, a trip signal is triggered to indicate the occurrence of an internal winding fault and the SSR is switched off. At step 436, a notification of internal winding fault is triggered. If the determination at step 432 is negative (i.e. $|(\angle IFT \times BIFI)| > |OIFI|$), the flowchart 400 loops back to step 412 to acquire a new second set of signals.

The inventors have recognised that the method as disclosed above in relation to a static electrical machine such as a transformer can be expanded to a rotating electrical machine, such as an IM, with modifications. In addition, a person skilled in the art would understand that the method as disclosed herein in relation to an IM can similarly be applied to a generator having similar mechanical and electrical components and configuration.

Figure 5A:
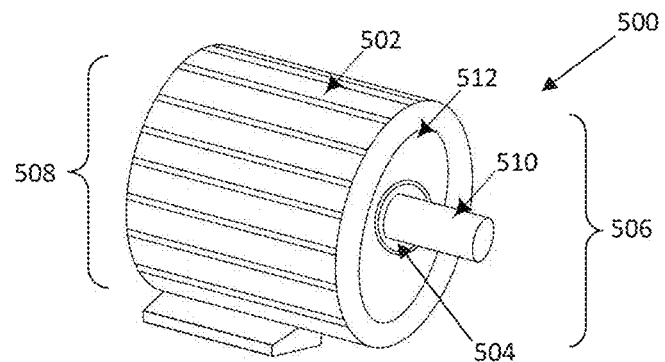
FIG. 5A is a perspective view drawing of an IM (induction motor) in an example embodiment.

FIG. 5A is a perspective view drawing of an IM 500 in an example embodiment. The IM 500 comprises a stator having a cylindrical frame 502 and a rotor 504 having a cylindrical body concentrically positioned/mounted and rotatable within the cylindrical frame of the stator 502. The stator comprises a plurality of electrically conductive windings (not shown) arranged therein and a pair of end shields e.g. 512 provided at both ends of the cylindrical frame of the stator 502. The IM 500 comprises a drive end 506 and a non-drive end 508. The rotor 504 comprises an elongated shaft member 510, said elongated shaft member 510 coaxially mounted to the rotor 504. As shown in FIG. 5A, the shaft member 510 is arranged to protrude from the rotor 504 at the drive end 506 to facilitate coupling of the rotor 504 to loads such as generators, pumps, gearboxes etc. The IM 500 may be energised by passing a varying electric current through the windings of the stator mounted by the stator frame 502 to produce varying magnetic fluxes. The varying magnetic fluxes then induces the rotor 504 and shaft member 510 to rotate about their respective longitudinal axes.

Figure 5B:
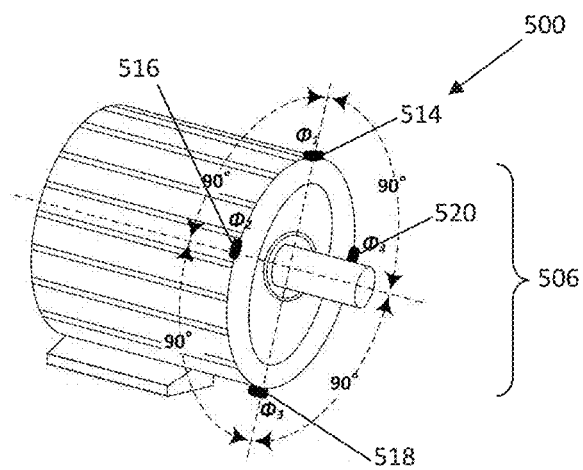
FIG. 5B is a perspective view drawing of the IM when viewed from the drive end in the example embodiment.

FIG. 5B is a perspective view drawing of the IM 500 when viewed from the drive end 506 in the example embodiment. In FIG. 5B, sensors e.g. flux sensors 514, 516, 518, 520 are abutted/placed on the external surface of the stator along the circumference of its cylindrical frame 502. In FIG. 5B, the positions of the flux sensors 514, 516, 518, 520 are at an edge of the stator 502 proximal to the drive end 506. The flux sensors 514, 516, 518, 520 are configured to acquire/sense/measure/detect signals e.g. end shield leakage fluxes $\varphi_1$, $\varphi_2$, $\varphi_3$, $\varphi_3$. The flux sensors 514, 516, 518, 520 are positioned such that any two adjacent flux sensors e.g. 514 and 516 along the circumference of the cylindrical frame has an angular separation of $$\frac{360}{P}$$

degrees. P is the number of poles. For example, for a 4-pole IM, the spatial angular separation between sensors would be 90 degrees and the number of flux sensors is four. Similarly, for a 2-pole IM, the spatial angular separation between sensors would be 180 degrees and the number of flux sensors is 2.

Figure 5C:
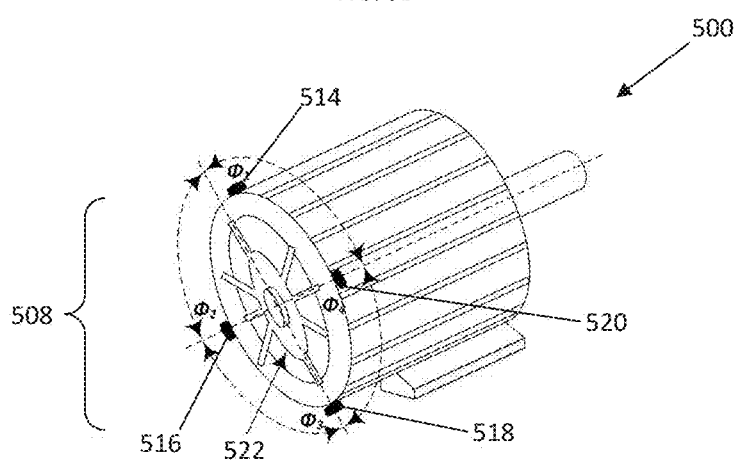
FIG. 5C is a perspective view drawing of the IM when viewed from the non-drive end in the example embodiment.

FIG. 5C is a perspective view drawing of the IM 500 when viewed from the non-drive end 508 in the example embodiment. As an alternative to placing sensors on the external surface of the stator frame 502 at the drive end 506 (as shown in FIG. 5B), sensors e.g. flux sensors 514, 516, 518, 520 are abutted/placed on the stator along the circumference of its cylindrical frame 502. In FIG. 5C, the positions of the flux sensors 514, 516, 518, 520 are at an edge of the stator 502 proximal to the non-drive end 508. The flux sensors 514, 516, 518, 520 are configured to acquire/sense/measure/detect signals e.g. end shield leakage fluxes $\varphi_1$, $\varphi_2$, $\varphi_3$, $\varphi_3$. The flux sensors 514, 516, 518, 520 are positioned such that any two adjacent flux sensors e.g. 514 and 516 along the circumference of the cylindrical frame has an angular separation of $$\frac{360}{P}$$

degrees w.r.t the longitudinal axis of the cylindrical frame of the stator 502. As shown in FIG. 5C, a fan 522 is attached to the shaft member 510 at the non-drive end 508 which cools the IM under running condition.

It would be appreciated that the sensors e.g. 514, 516, 518, 520 are positioned proximate (i.e. near or at) the stator along the circumference of its cylindrical frame 502. The position of the first sensor 514 is diametrically opposite to the third sensor 518 and the second sensor 516 is diametrically opposite to the fourth sensor 520.

Figure 6:
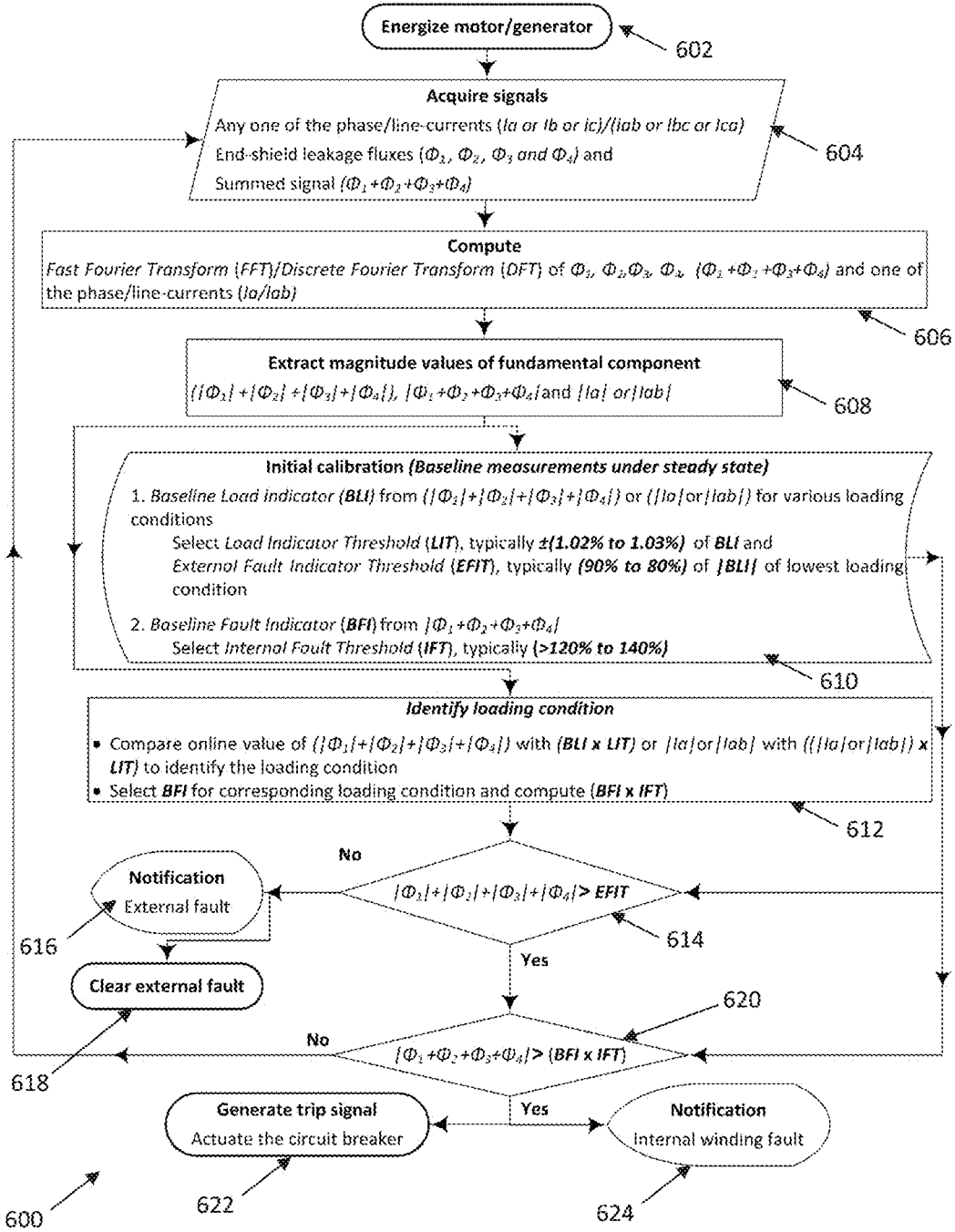
FIG. 6 is a schematic flowchart illustrating a method of detecting winding fault in an IM in an example embodiment.

FIG. 6 is a schematic flowchart 600 illustrating a method of detecting winding fault in an IM (compare 500 of FIG. 5) in an example embodiment. At step 602, the IM is energised by passing energising current through the windings of the IM. At step 604, a set of signals is acquired from the IM, said set of signals comprising any one of the phase/line currents ($I_a$ or $I_b$ or $I_c$)/($I_{ab}$ or $I_{bc}$ or $I_{ca}$), and flux signals e.g. end-shield leakage fluxes ($\varphi_1$, $\varphi_2$, $\varphi_3$, and $\varphi_4$). The set of four flux signals are summed to obtain a total flux signal ($\varphi_1+\varphi_2+\varphi_3+\varphi_4$). The number of leakage flux signals to be measured is based on the number of poles of the IM. For example, a 4-pole IM requires four flux sensors. At step 606, Fourier transform is performed on the set of signals and the total flux signal. For example, Fast Fourier Transform (FFT) or Discrete Fourier Transform (DFT) of $\varphi_1$, $\varphi_2$, $\varphi_3$, $\varphi_4$, ($\varphi_1+\varphi_2+\varphi_3+\varphi_4$) and one of the phase-/line-currents ($I_a/I_{ab}$) is performed in step 606. At step 608, magnitude values of fundamental component of ($|\varphi_1|+|\varphi_2|+|\varphi_3|+|\varphi_4|$), $|\varphi_1+\varphi_2+\varphi_3+\varphi_4|$ and $|I_a|$ or $|I_{ab}|$ are extracted.

At step 610, initial calibration (baseline measurements under steady state) is performed to obtain a baseline load indicator (BLI). The BLI is obtained based on a sum of the respective magnitudes of the four flux signals or either one of a phase-current magnitude or line-current magnitude of IM. For example, initial calibration comprises obtaining a BLI from $(|\varphi_1|+|\varphi_2|+|\varphi_3|+|\varphi_4|)$ or $(|I_a|$ or $|I_{ab}|)$ for various loading conditions, selecting a load indicator threshold (LIT), where LIT is typically ±(1.02% to 1.03%) of BLI, and selecting an external fault indicator threshold (EFIT), where EFIT is typically (90% to 80%) of |BLI| of the lowest loading condition. Initial calibration also comprises obtaining a baseline fault indicator (BFI). The BFI is obtained by summing the set of four flux signals to obtain a total flux signal and obtaining the magnitude of the total flux signal during initial calibration. For example, the BFI is obtained from $|\varphi_1+\varphi_2+\varphi_3+\varphi_4|$, and selecting an internal fault threshold (IFT), where IFT is typically greater than 120% to 140% of the BFI. It would be appreciated that the EFIT, LIT and IFT are not limited to the above ranges and may be changed depending on the level of sensitivity required. For example, the EFIT may be 90%, 85%, or 80% of the BLI of the lowest loading condition. For example, the LIT may be 1.01%, 1.02%, 1.03% or 1.04% of the BLI. For example, the IFT may be 120%, 130%, or 140% of the BFI. It would also be appreciated that the BLI and BFI may have been obtained previously and that step 610 may be skipped.

At step 612, loading condition of the IM is identified by comparing the summed value of respective magnitudes of the four flux signals, or phase-current magnitude or line-current magnitude with corresponding pre-calibrated values. For example, loading condition of the IM is identified by comparing an online value of $(|\varphi_1|+|\varphi_2|+|\varphi_3|+|\varphi_4|)$ with the product of BLI and LIT, or by comparing $|I_a|$ or $|I_{ab}|$ with the product of ($|I_a|$ or $|I_{ab}|$) and LIT). At step 612, a BFI is also selected for the corresponding loading condition and the product of BFI and IFT is computed.

At step 614, a decision is determined whether the magnitude value of the $(|\varphi_1|+|\varphi_2|+|\varphi_3|+|\varphi_4|)$ is beyond an acceptable threshold, i.e. greater than EFIT. Step 614 is used to detect and discriminate an external fault (i.e. things/events that happen outside the induction motor) from an internal winding fault in the IM. If the determination at step 614 is negative (i.e. $(|\varphi_1|+|\varphi_2|+|\varphi_3|+|\varphi_4|)$ is equal to or lower than EFIT), the flowchart 600 proceeds to steps 616 and 618. At step 616, a notification is triggered to indicate the occurrence of an external fault, i.e. a fault that happens outside the IM. At step 618, the external fault is cleared. If the determination at step 614 is affirmative (i.e. $(|\varphi_1|+|\varphi_2|+|\varphi_3|+|\varphi_4|)$ is greater than EFIT), the flowchart 600 proceeds to step 620.

At step 620, a decision is determined whether the absolute value of $|\varphi_1+\varphi_2+\varphi_3+\varphi_4|$ is greater than the product of BFI and IFT. That is, step 620 determines whether the magnitude value of the sum of leakage flux signals from the four flux sensors differs from the magnitude value of the BFI by e.g. more than 20%, by more than 30%, by more than 40% or by more than 50%. If the determination at step 620 is affirmative (i.e. $|\varphi_1+\varphi_2+\varphi_3+\varphi_4|>(BFI\times IFT)$), the flowchart 600 proceeds to steps 622 and 624. At step 622, a trip signal is triggered to indicate the occurrence of an internal winding fault and a circuit breaker is actuated to stop the flow of current in the IM. At step 624, a notification of internal winding fault is triggered. If the determination at step 620 is negative (i.e. $|\varphi_1+\varphi_2+\varphi_3+\varphi_4|\leq(BFI\times IFT)$), the flowchart 600 loops back to step 604 to acquire a new set of signals.

It would be appreciated that the method for detecting winding fault in an IM can similarly be applied to a generator having similar mechanical and electrical components and configuration.

Comparison of Transformer Winding Fault Indicator with Classical DNSC Based Technique Traditionally, terminal currents based differential protection technique are used to protect the transformer from internal and external faults. However, the classical differential protection systems are insensitive to detect low severity turn faults which eventually lead to ground faults and enormous repair cost. Sensitivity of the traditional differential protection systems is increased by Negative Sequence Current (NSC) based differential protection which can detect as low as 4-turns (1% of total turns). Therefore, the performance of the technique as disclosed herein and DNSC based techniques are compared to identify the pros and cons of the technique disclosed herein w.r.t to the widely used traditional DNSC-based technique. The DNSC are represented by equation (1).

$$I_{DNSC} = \begin{bmatrix} \frac{1}{3} & \frac{a^2}{3} & \frac{a}{3} \end{bmatrix} \left[ \begin{bmatrix} I_{pa} \\ I_{pb} \\ I_{pc} \end{bmatrix} - \begin{bmatrix} \left(\frac{V_{s1a}}{V_{pa}}\right)I_{s1a} \\ \left(\frac{V_{s1b}}{V_{pb}}\right)I_{s1b} \\ \left(\frac{V_{s1c}}{V_{pc}}\right)I_{s1c} \end{bmatrix} - \begin{bmatrix} \left(\frac{V_{s2a}}{V_{pa}}\right)I_{s2a} \\ \left(\frac{V_{s2b}}{V_{pb}}\right)I_{s2b} \\ \left(\frac{V_{s2c}}{V_{pc}}\right)I_{s2c} \end{bmatrix} \right] \quad (1)$$

where,
$V_{pa}^*$, $V_{pb}^*$ and $V_{pc}^*$ Terminal voltages of the primary windings.
$I_{pa}^*$, $I_{pb}^*$ and $I_{pc}^*$ Terminal currents of the primary windings.
$V_{s1a}^*$, $V_{s2b}^*$ and $V_{s1c}^*$ Terminal voltages of the secondary winding-1.
$V_{s2a}^*$, $V_{s2b}^*$ and $V_{s2c}^*$ Terminal voltages of the secondary winding-2.
$I_{s1a}^*$, $I_{s1b}^*$ and $I_{s1c}^*$ Terminal currents of the secondary winding-1.
$I_{s2a}^*$, $I_{s2b}^*$ and $I_{s2c}^*$ Terminal currents of the secondary winding-2.
a Phase-displacement operator
$I_{DNSC}$ Differential negative sequence current.
* Fundamental phasor.

Figure 7A:
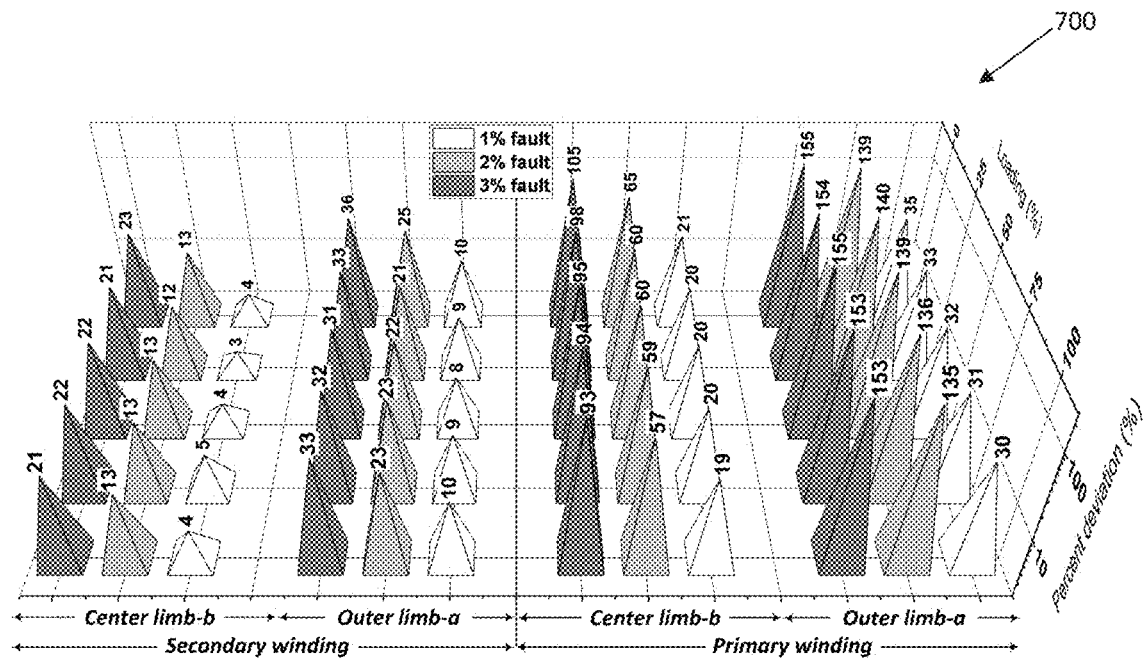
FIG. 7A is a 3D (three-dimensional) chart comparing the percent deviation of angle values obtained using the exemplary technique disclosed herein under various fault severities w.r.t to a healthy operating condition of a 10 kVA, three-phase, three-winding transformer.

FIG. 7A is a 3D chart 700 comparing the percent deviation of angle values obtained using the exemplary technique disclosed herein under various fault severities w.r.t to a healthy operating condition of a 10 kVA, three-phase, three-winding transformer (compare 200 of FIG. 2).

Figure 7B:
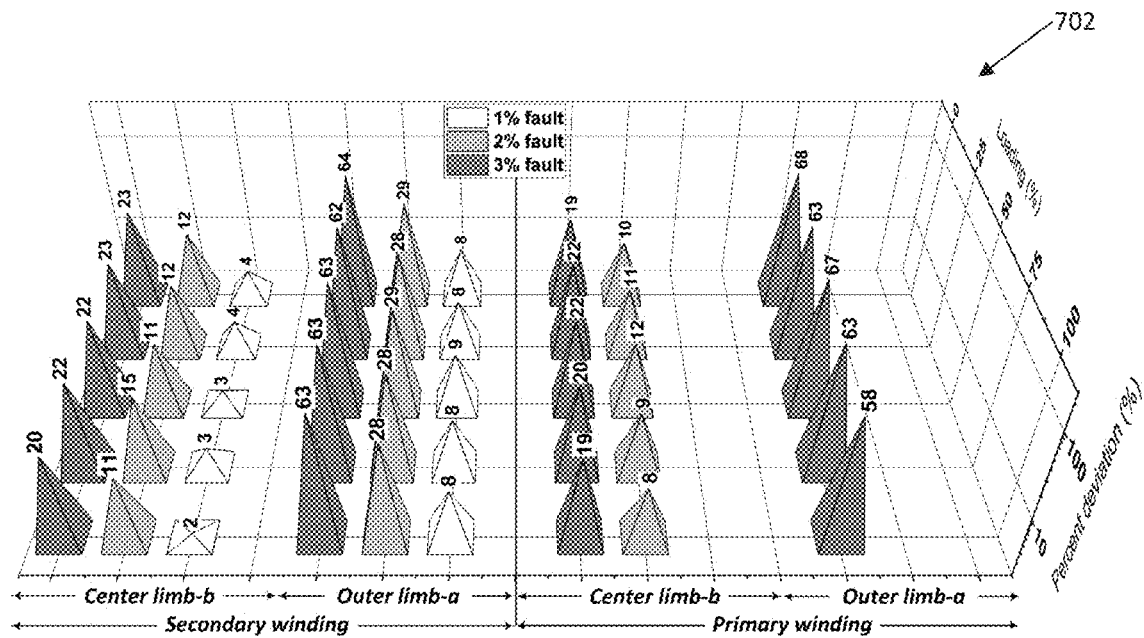
FIG. 7B is a 3D chart comparing the percent deviation of magnitude values obtained using the exemplary technique disclosed herein under various fault severities w.r.t to a healthy operating condition of a 10 kVA, three-phase, three-winding transformer.

FIG. 7B is a 3D chart 702 comparing the percent deviation of magnitude values obtained using the exemplary technique disclosed herein under various fault severities w.r.t to a healthy operating condition of a 10 kVA, three-phase, three-winding transformer (compare 200 of FIG. 2).

The following conclusions can be inferred from FIG. 7A and FIG. 7B.
1) The angle percent deviations of the technique disclosed herein for winding faults at the outer- and centre-limbs of the primary winding are consistently greater than or equal to 19% for various fault severities under different loading conditions. However, the angle percent deviations of winding faults at the outer- and centre-limbs of the secondary winding are relatively lesser than winding fault at the primary winding. The technique disclosed herein shows the least angle percent deviation for winding fault at the centre-limb of the secondary winding which is about 3%.
2) The magnitude percent deviations of the technique disclosed herein for 1% fault severity for winding faults at the outer- and centre-limbs of the primary winding and 2% fault severity for winding faults at the outer-limb of the primary winding are negative, which means the magnitude values under winding fault is lesser when compared to the healthy operating conditions. However, the magnitude percent deviations for 3% fault severity at the outer- and centre-limbs and 2% fault severity at the centre-limb of the primary winding are positive. Since, the magnitude percent deviations for winding faults at outer- and centre-limbs of the primary winding are not monotonic, it is not a reliable indicator of primary winding fault. However, the magnitude percent deviations of the technique disclosed herein for winding fault at the outer- and centre-limbs of the secondary winding are monotonic and show consistent fault detection capability for various fault severities under different loading conditions.

Figure 8A:
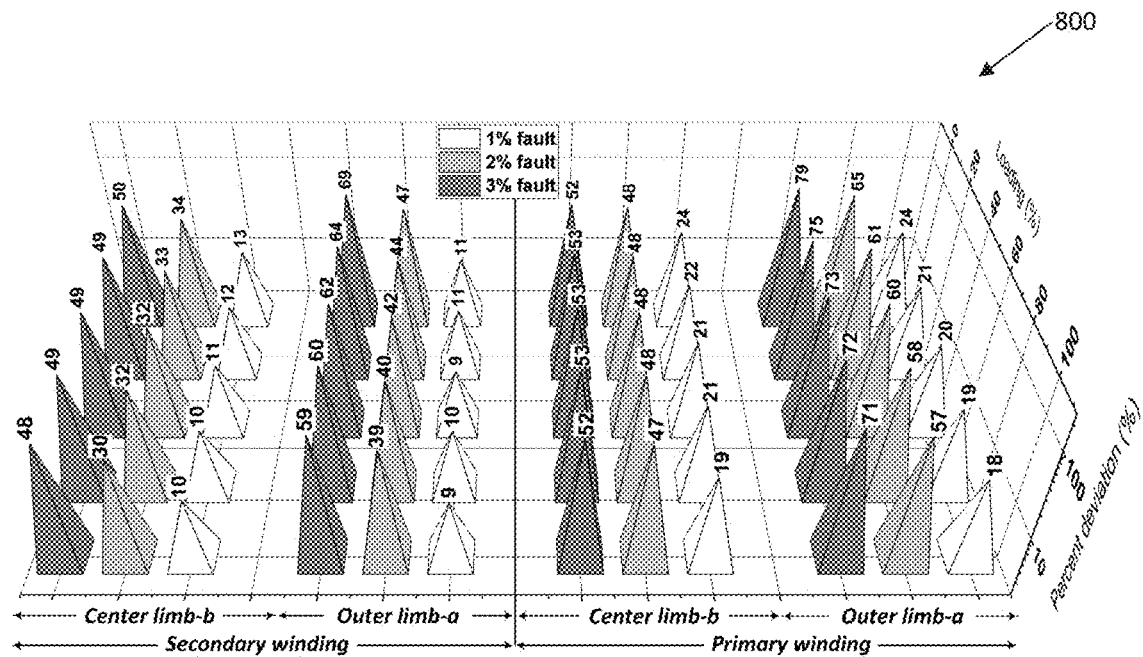
FIG. 8A is a 3D chart comparing the percent deviation of angle values obtained using the Differential Negative Sequence Current (DNSC) technique under various fault severities w.r.t to a healthy operating condition of a 10 kVA, three-phase, three-winding transformer.

FIG. 8A is a 3D chart 800 comparing the percent deviation of angle values obtained using the DNSC technique under various fault severities w.r.t to a healthy operating condition of a 10 kVA, three-phase, three-winding transformer (compare 200 of FIG. 2).

Figure 8B:
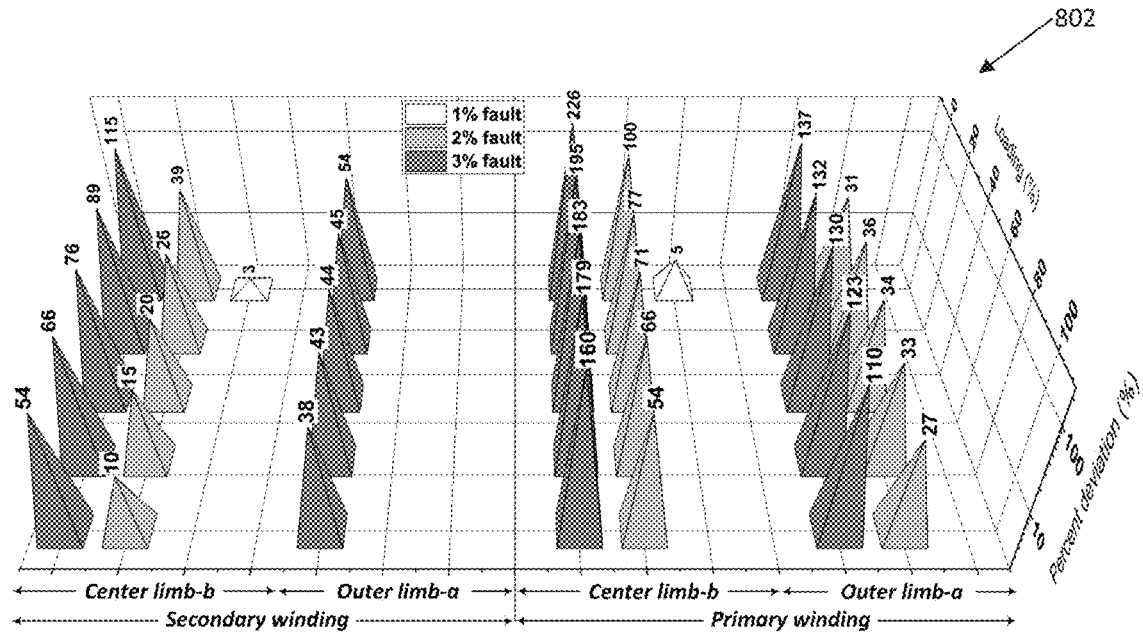
FIG. 8B is a 3D chart comparing the percent deviation of magnitude values obtained using the Differential Negative Sequence Current (DNSC) technique under various fault severities w.r.t to a healthy operating condition of a 10 kVA, three-phase, three-winding transformer.

FIG. 8B is a 3D chart 802 comparing the percent deviation of magnitude values obtained using the DNSC technique under various fault severities w.r.t to a healthy operating condition of a 10 kVA, three-phase, three-winding transformer (compare 200 of FIG. 2).

The following conclusions can be inferred from FIG. 8A and FIG. 8B.

1) The angle percent deviations of DNSC technique for winding faults at the outer- and centre-limbs of the primary winding are consistently greater than or equal to 18% for various fault severities under different loading conditions. However, the angle percent deviations of the winding faults at the outer- and centre-limbs of the secondary winding are relatively lesser than the winding fault at the primary winding. The DNSC shows the least angle percent deviation of about 9% for winding fault at the secondary winding.

2) The magnitude percent deviation of DNSC technique for winding faults at the outer- and centre-limbs of the primary- and secondary-windings do not show a monotonic trend for reliable winding fault detection under various fault severities and loading conditions. Therefore, magnitude percent deviation of DNSC technique alone is not a reliable indicator of winding fault at the primary and secondary windings of the transformer.

From FIG. 7A, FIG. 7B, FIG. 8A and FIG. 8B, the following conclusions can be inferred.

1) The angle percent deviations of the technique disclosed herein for winding faults at the outer- and centre-limbs of the primary winding are better than the most widely used terminal-measurement based DNSC technique. However, for winding faults at the outer- and centre-limbs of the secondary winding, the angle percent deviations of DNSC technique are better than the technique disclosed herein.

2) The magnitude percent deviations for winding faults at the outer- and centre-limbs of the primary winding do not show a monotonic trend for both the technique disclosed herein and DNSC technique. However, for winding faults at the outer- and centre-limbs of the secondary winding, the technique disclosed herein shows a monotonic trend and consistent fault detection capability when compared to DNSC technique.

3) The winding fault at the outer- and centre-limbs of the primary- and secondary-windings of the transformer can be detected by using either the angle value or a combination of both angle and magnitude values of the technique disclosed herein. By combining both angle and magnitude values, the sensitivity for detecting winding fault at outer- and centre-limbs of the secondary winding of the transformer can be increased.

4) Overall, the fault detection capability of the technique disclosed herein is better than the DNSC technique for primary winding faults and shows consistent percent deviation in both angle and magnitude values for faults in the secondary winding.

Benefits of Winding Fault Detection of Transformer by Core-Leakage/-Linkage Fluxes For a three-phase, three-winding transformer, the DNSC based technique requires 9-VTs and 9-CTs as given by equation (1). However, VTs can be eliminated in transformers without OLTC (on-load tap changer), as the transformation ratio of the terminal currents remains unaltered. Nonetheless, VTs eliminate the additional phase angle shift compensation for the secondary and primary currents and increases the sensitivity of DNSC based techniques. The total number of CTs and VTs increases the total cost of the protection system.

Moreover, the cost of the CTs and VTs increases with the increase in the power level. However, the technique disclosed herein is based on the core-leakage/-linkage flux which is proportional to the core-flux. Typically, the value of core-flux of a power transformer varies from 0.2 T to 1.8 T depending on the iron losses in the magnetic circuit. Considering the maximum working core-flux density, the sensor cost of the exemplary technique disclosed herein is fixed and is relatively insignificant when compared to the cost of the CTs and VTs.

Altogether, the technique as disclosed herein is inexpensive and its performance is on par with the classical DNSC based technique in detecting the low-severity winding faults. Furthermore, the online fault indicator can be implemented as a standalone fault detection system or as an add-on/complement to the existing DNSC based system to increase the confidence level of winding fault detection.

Figure 9:
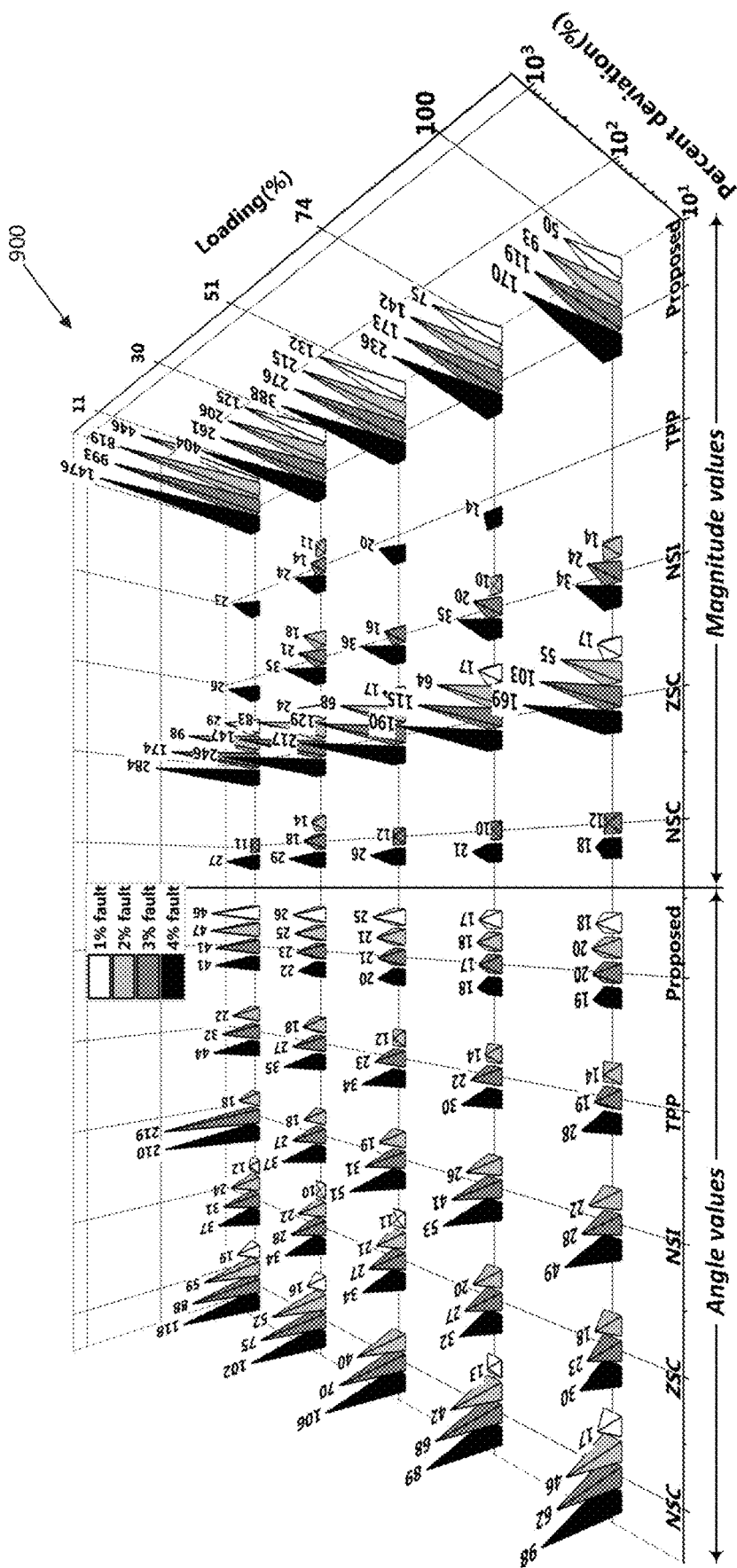
FIG. 9 is a 3D chart comparing percent deviation of magnitude and angle values obtained using the exemplary technique disclosed herein and various terminal measurement-based techniques under various fault severities w.r.t to a healthy operating condition of a 10 hp (horse power), 4-pole IM.

Comparison of IM Winding Fault Indicator with Various Terminal Measurement-Based Techniques FIG. 9 is a 3D chart 900 comparing the percent deviation of magnitude and angle values obtained using the exemplary technique disclosed herein and various terminal measurement-based techniques under various fault severities w.r.t a healthy operating condition of a 10 hp, 4-pole IM (compare 300 of FIG. 3). The percent deviation of magnitude and angle values of the technique disclosed herein, and various terminal measurement-based techniques under various winding fault conditions w.r.t healthy operating conditions are shown in FIG. 9. For better depiction, the percent deviation axis is represented in logarithmic scale with a lower limit of 10%. The percent deviation of angle and magnitude values which are less than or equal to 10 is neglected in FIG. 9. The angle values of various techniques as presented in FIG. 9 are calculated w.r.t to the phase-voltage, $V_{ab}$ of the motor. The following conclusions can be inferred from FIG. 9.

1) The magnitude percent deviation of the technique as disclosed herein (with reference to the column labelled as "Proposed") is superior to various terminal measurement-based techniques for various fault severities under different loading conditions. The technique as disclosed herein shows the most consistent winding fault detection capability followed by Zero Sequence Current (ZSC). However, the percent deviation of ZSC is less than the technique disclosed herein. The magnitude percent deviation of techniques such as Negative Sequence Current (NSC), Negative Sequence Impedance (NSI) and Total Phase Power (TPP) does not show consistent fault detection capability as that of the technique disclosed herein and ZSC.

2) The angle percent deviation of the technique disclosed herein (with reference to the column labelled as "Proposed") shows consistent fault detection capability for various fault severities under different loading conditions. However, the percent deviation of angle values of NSC is more than the technique disclosed herein. Nonetheless, the technique disclosed herein shows better percent deviation under low-severity faults such as 1% when compared to the NSC. The angle percent deviation of techniques such as ZSC, NSI and TPP does not show consistent fault detection capability as that of the technique disclosed herein and NSC.

3) Although the angle percent deviation of NSC is more than the technique disclosed herein, the magnitude percent deviation of the technique disclosed herein is much greater than the angle percent deviation of NSC for various fault severities under different loading conditions. Hence, only the magnitude percent deviation of the technique disclosed herein is a superior indicator of winding fault of various severities under different loading conditions when compared to different terminal measurement-based techniques.

Benefits of Winding Fault Detection of IM by End-Shield Leakage Fluxes

The NSI and TPP requires three voltage and three current sensors for both magnitude and angle percent deviation computation for a three phase IM. The NSC and ZSC require three line- and phase-currents sensors respectively for magnitude percent deviation computation. The technique disclosed herein requires P flux sensors, where, P is the number of poles. For example, the comparison results shown in FIG. 9 are obtained from a 10 hP, 4-pole IM, Therefore, 4 flux sensors are required. For angle percent deviation computation of NSC, ZSC and the technique disclosed herein, additional line-/phase-voltage sensor is required. The sensor cost of any technique which is based on line-/phase-currents and line-/phase-voltages increase with increase in the power- and voltage-level. Therefore, terminal measurements such as currents and voltages based sensitive techniques such as ANSI 46 NSC is widely used for critical and expensive LV IMs and MV/HV IMs. From FIG. 9, it is apparent that the magnitude percent deviation of the technique disclosed herein is superior to various terminal measurement-based techniques, including most widely used ANSI 46 NSC with additional advantage of nominal sensor cost for various power-/voltage-levels w.r.t to various terminal measurement based techniques.

Example embodiments as disclosed herein describe a method and a system of detecting winding fault during online operation of an electrical machine e.g. a transformer or an IM.

Example embodiments as disclosed herein describe a method which detects winding fault during online operation of an electrical machine by positioning two or more flux sensors on the external surface of the machine. By positioning two or more flux sensors on the external surface of the machine, the method may be performed while the machine is operating online. That is, the method may be performed without taking the machine offline e.g. disconnecting the machine from a power system network. In addition, by positioning two or more flux sensors on the external surface of the machine, the method may be performed in a non-invasive manner, i.e. without substantially dismantling the machine e.g. dismantling of primary and secondary windings of a static electrical machine such as a transformer or stator and rotor of a rotating electrical machine such as a motor or generator. As the method as disclosed herein is performed during online operation of the machine, the method may advantageously provide continuous monitoring of winding abnormalities.

Example embodiments as disclosed herein describe a method which detects winding faults by measuring leakage/ linkage fluxes e.g. core-leakage/-linkage fluxes from a transformer and IMs. Example embodiments of the method using this approach have been evaluated under various loading, fault severities and supply voltage unbalance conditions. Results have demonstrated that example embodiments of the method are immune to loading and supply voltage unbalance conditions, thereby avoiding spurious fault notification. Example embodiments of the method for transformer winding fault detection may advantageously be comparable to DNSC based techniques in terms of sensitivity. Example embodiments of the method for IM winding fault detection may be more sensitive than the various terminal-measurement based techniques.

Example embodiments of the method as disclosed herein may provide a relatively inexpensive low-severity winding fault detection and discrimination technique for equipment due to reduced sensor cost. This may advantageously allow the method to be implemented for machines e.g. transformers and IMs of various power ratings used for critical applications. For example, two relatively inexpensive flux sensors (e.g. costing about US$2 per sensor) are required to measure the fundamental component (50 Hz/60 Hz) of the core-leakage/-linkage fluxes at a transformer's outer limbs. In one example embodiment, a total of two flux sensors is required for a three-phase three winding transformer. That is, the system for detecting winding faults consists of only two flux sensors positioned on the external surface of the transformer. In another example embodiment, a total of two flux sensors is required for a 2-pole IM. In another example embodiment, a total of four flux sensors is required for a 4-pole IM. That is, the system for detecting winding faults consists of only four flux sensors positioned on the external surface of the IM. Example embodiments of the method may provide up to 78% reduction in the total number of sensors required for a three-phase three-winding transformer and up to 93% reduction in the sensor cost for a three-phase three winding transformer of 10 kVA power rating. Example embodiments of the method may provide up to 92% reduction in the sensor cost for a three-phase, 4-pole IM of 10 hp power rating. As such, the method as disclosed herein may be applied in the development of inexpensive protection systems such that the cost of a developed system is nominal with respect to the capital cost of critical equipment and could potentially lead to wide deployment of the developed system for machines e.g. transformers and IMs of various power levels used for different applications.

Example embodiments of the method as disclosed herein for transformers, when implemented in a low-cost health monitoring machine, can be easily retrofitted in a non-invasive manner to machines e.g. dry-type transformers where DNSC based techniques are not economical or as an add-on to the existing DNSC based technique to increase the confidence level of internal fault detection. Similarly, a low-cost health monitoring machine implemented with the method as disclosed herein for IMs can be easily retrofitted in a non-invasive manner to all IMs where expensive terminal measurement based protection systems are not economical or as an add-on to the existing protection technique to increase the overall fault detection range and sensitivity.

The terms "coupled" or "connected" as used in this description are intended to cover both directly connected or connected through one or more intermediate means, unless otherwise stated.

The description herein may be, in certain portions, explicitly or implicitly described as algorithms and/or functional operations that operate on data within a computer memory or an electronic circuit. These algorithmic descriptions and/or functional operations are usually used by those skilled in the information/data processing arts for efficient description. An algorithm is generally relating to a self-consistent sequence of steps leading to a desired result. The algorithmic steps can include physical manipulations of physical quantities, such as electrical, magnetic or optical signals capable of being stored, transmitted, transferred, combined, compared, and otherwise manipulated.

Further, unless specifically stated otherwise, and would ordinarily be apparent from the following, a person skilled in the art will appreciate that throughout the present specification, discussions utilizing terms such as "scanning", "calculating", "determining", "replacing", "generating", "initializing", "outputting", and the like, refer to action and processes of an instructing processor/computer system, or similar electronic circuit/machine/component, that manipulates/processes and transforms data represented as physical quantities within the described system into other data similarly represented as physical quantities within the system or other information storage, transmission or display machines etc.

The algorithms described herein can be implemented in a machine/apparatus specially configured for performing the steps of the described methods. Such apparatus may be specifically constructed for the purposes of the methods or may comprise a general-purpose computer/processor or other machine selectively activated or reconfigured by a computer program stored in a storage member. The algorithms and displays described herein are not inherently related to any computer or other apparatus. It is understood that general purpose devices/machines may be used in accordance with the teachings herein. Alternatively, the construction of a specialized machine/apparatus to perform the method steps may be desired.

For example, a system for detecting winding fault during online operation of an electrical machine may be provided. The system may comprise a power supply unit for providing power to operate the system, a receiver unit for receiving a set of signals acquired from the machine over a period, a signal pre-processing unit for pre-processing the set of signals; and a Digital Signal Processor (DSP) or a Field Programmable Gate Array (FPGA) or a microcontroller or a microprocessor. The set of signals may comprise two or more magnetic flux signals. Each flux signal may be obtained from a respective flux sensor positioned on the external surface of the machine. The DSP/FPGA/microcontroller/microprocessor may be configured to perform various tasks, such as, extracting a winding fault indicator from the set of signals, comparing the winding fault indicator with a baseline indicator, and determining the winding fault when the winding fault indicator deviates from the baseline indicator by a threshold. The DSP/FPGA/microcontroller/microprocessor may also be configured to trigger a trip signal indicating presence of winding fault when the winding fault is determined. The system may further comprise a communication unit connected to a server e.g. cloud based IOT (Internet of things) server. For example, the system connected to a cloud based IOT server may be used for remote monitoring and detection of winding fault during online operation of an electrical machine.

In addition, it is submitted that the description also implicitly covers a computer program, in that it would be clear that the steps of the methods described herein may be put into effect by computer code. It will be appreciated that a large variety of programming languages and coding can be used to implement the teachings of the description herein. Moreover, the computer program if applicable is not limited to any control flow and can use different control flows without departing from the scope of the invention.

Furthermore, one or more of the steps of the computer program if applicable may be performed in parallel and/or sequentially. Such a computer program if applicable may be stored on any computer readable medium. The computer readable medium may include storage machines such as magnetic or optical disks, memory chips, or other storage machines suitable for interfacing with a suitable reader/general purpose computer. In such instances, the computer readable storage medium is non-transitory. Such storage medium also covers all computer-readable media e.g. medium that stores data only for short period and/or only in the presence of power, such as register memory, processor cache and Random Access Memory (RAM) and the like. The computer readable medium may even include a wired medium such as exemplified in the Internet system, or wireless medium such as exemplified in Bluetooth/WIFI/Zigbee technology. The computer program when loaded and executed on a suitable reader effectively results in an apparatus that can implement the steps of the described methods.

The example embodiments may also be implemented as hardware modules. A module is a functional hardware unit designed for use with other components or modules. For example, a module may be implemented using digital or discrete electronic components, or it can form a portion of an entire electronic circuit such as an Application Specific Integrated Circuit (ASIC). A person skilled in the art will understand that the example embodiments can also be implemented as a combination of hardware and software modules.

Additionally, when describing some embodiments, the disclosure may have disclosed a method and/or process as a sequence of steps. However, unless otherwise required, it will be appreciated the method or process should not be limited to the sequence of steps disclosed. Other sequences of steps may be possible. The order of the steps disclosed herein should not be construed as undue limitations. Unless otherwise required, a method and/or process disclosed herein should not be limited to the steps being carried out in the order written. The sequence of steps may be varied and remain within the scope of the disclosure.

Further, in the description herein, the word "substantially" whenever used is understood to include, but not restricted to, "entirely" or "completely" and the like. In addition, terms such as "comprising", "comprise", and the like whenever used, are intended to be non-restricting descriptive language in that they broadly include elements/components recited after such terms, in addition to other components not explicitly recited. For an example, when "comprising" is used, reference to a "one" feature is also intended to be a reference to "at least one" of that feature. Terms such as "consisting", "consist", and the like, may, in the appropriate context, be considered as a subset of terms such as "comprising", "comprise", and the like. Therefore, in embodiments disclosed herein using the terms such as "comprising", "comprise", and the like, it will be appreciated that these embodiments provide teaching for corresponding embodiments using terms such as "consisting", "consist", and the like. Further, terms such as "about", "approximately" and the like whenever used, typically means a reasonable variation, for example a variation of +/−5% of the disclosed value, or a variance of 4% of the disclosed value, or a variance of 3% of the disclosed value, a variance of 2% of the disclosed value or a variance of 1% of the disclosed value.

Furthermore, in the description herein, certain values may be disclosed in a range. The values showing the end points of a range are intended to illustrate a preferred range. Whenever a range has been described, it is intended that the range covers and teaches all possible sub-ranges as well as individual numerical values within that range. That is, the end points of a range should not be interpreted as inflexible limitations. For example, a description of a range of 1% to 5% is intended to have specifically disclosed sub-ranges 1% to 2%, 1% to 3%, 1% to 4%, 2% to 3% etc., as well as individually, values within that range such as 1%, 2%, 3%, 4% and 5%. The intention of the above specific disclosure is applicable to any depth/breadth of a range.

Figure 10:
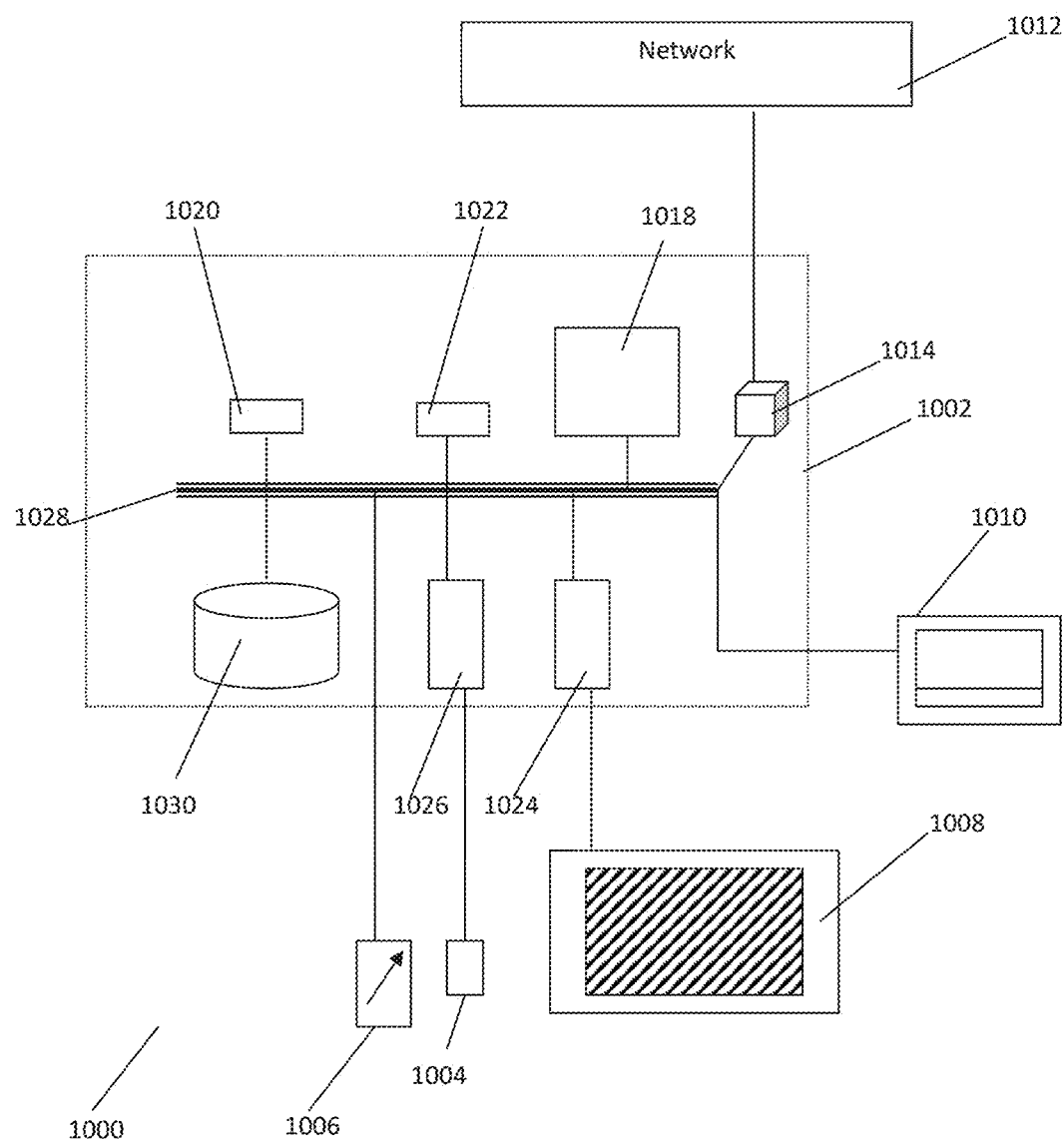
FIG. 10 is a schematic drawing of a computer system suitable for implementing the described example embodiments.

Different example embodiments can be implemented in the context of data structure, program modules, program and computer instructions executed in a computer implemented environment. A general-purpose computing environment is briefly disclosed herein. One or more example embodiments may be embodied in one or more computer systems, such as is schematically illustrated in FIG. 10.

One or more example embodiments may be implemented as software, such as a computer program being executed within a computer system 1000 and instructing the computer system 1000 to conduct a method of an example embodiment. In various embodiments, the computer system 1000 is specially configured to perform the method of fault detection as disclosed herein.

The computer system 1000 comprises a computer unit 1002, input modules such as a keyboard 1004 and a pointing device 1006 and a plurality of output devices such as a display 1008, and printer 1010. A user can interact with the computer unit 1002 using the above devices. The pointing device can be implemented with a mouse, track ball, pen device or any similar device. One or more other input devices (not shown) such as a joystick, game pad, satellite dish, scanner, touch sensitive screen or the like can also be connected to the computer unit 1002. The display 1008 may include a cathode ray tube (CRT), liquid crystal display (LCD), field emission display (FED), plasma display or any other device that produces an image that is viewable by the user.

The computer unit 1002 can be connected to a computer network 1012 via a suitable transceiver device 1014, to enable access to e.g. the Internet or other network systems such as Local Area Network (LAN) or Wide Area Network (WAN) or a personal network. The network 1012 can comprise a server, a router, a network personal computer, a peer device or other common network node, a wireless telephone or wireless personal digital assistant. Networking environments may be found in offices, enterprise-wide computer networks and home computer systems etc. The transceiver device 1014 can be a modem/router unit located within or external to the computer unit 1002 and may be any type of modem/router such as a cable modem or a satellite modem.

It will be appreciated that network connections shown are exemplary and other ways of establishing a communications link between computers can be used. The existence of any of various protocols, such as TCP/IP, Frame Relay, Ethernet, FTP, HTTP and the like, is presumed, and the computer unit 1002 can be operated in a client-server configuration to permit a user to retrieve web pages from a web-based server. Furthermore, any of various web browsers can be used to display and manipulate data on web pages.

The computer unit 1002 in the example comprises a processor 1018, a Random Access Memory (RAM) 1020 and a Read Only Memory (ROM) 1022. The processor 1018 may include a general processor, DSP, an application specific integrated circuit (ASIC), FPGA, microcontroller, analog circuits, digital circuits, combinations thereof, or other now known or later developed processor. The processor 1018 may be a single device or combinations of devices, such as associated with a network, distributed processing, or cloud computing. The ROM 1022 can be a system memory storing basic input/output system (BIOS) information. The RAM 1020 can store one or more program modules such as operating systems, application programs and program data.

The computer unit 1002 further comprises several Input/Output (I/O) interface units, for example I/O interface unit 1024 to the display 1008, and I/O interface unit 1026 to the keyboard 1004. The components of the computer unit 1002 typically communicate and interface/couple connectedly via an interconnected system bus 1028 and in a manner known to the person skilled in the relevant art. The bus 1028 can be any of several types of bus structures including a memory bus or memory controller, a peripheral bus, and a local bus using any of a variety of bus architectures.

It will be appreciated that other devices can also be connected to the system bus 1028. For example, a universal serial bus (USB) interface can be used for coupling a video or digital camera or sensors or a data acquisition system to the system bus 1028. An IEEE 1394 interface may be used to couple additional devices to the computer unit 1002. Other manufacturer interfaces are also possible such as FireWire developed by Apple Computer and i.Link developed by Sony. Coupling of devices to the system bus 1028 can also be via a parallel port, a game port, a PCI board or any other interface used to couple an input device to a computer. It will also be appreciated that, while the components are not shown in the figure, sound/audio can be recorded and reproduced with a microphone and a speaker. A sound card may be used to couple a microphone and a speaker to the system bus 1028. It will be appreciated that several peripheral devices can be coupled to the system bus 1028 via alternative interfaces simultaneously.

An application program can be supplied to the user of the computer system 1000 being encoded/stored on a data storage medium such as a CD-ROM or flash memory carrier. The application program can be read using a corresponding data storage medium drive of a data storage device 1030. The data storage medium is not limited to being portable and can include instances of being embedded in the computer unit 1002. The data storage device 1030 can comprise a hard disk interface unit and/or a removable memory interface unit (both not shown in detail) respectively coupling a hard disk drive and/or a removable memory drive to the system bus 1028. This can enable reading/writing of data. Examples of removable memory drives include magnetic disk drives and optical disk drives. The drives and their associated computer-readable media, such as a floppy disk provide non-volatile storage of computer readable instructions, data structures, program modules and other data for the computer unit 1002. It will be appreciated that the computer unit 1002 may include several of such drives. Furthermore, the computer unit 1002 may include drives for interfacing with other types of computer readable media.

The application program is read and controlled in its execution by the processor 1018. Intermediate storage of program data may be accomplished using RAM 1020. The method(s) of the example embodiments can be implemented as computer readable instructions, computer executable components, or software modules. One or more software modules may alternatively be used. These can include an executable program, a data link library, a configuration file, a database, a graphical image, a binary data file, a text data file, an object file, a source code file, or the like. When one or more computer processors execute one or more of the software modules, the software modules interact to cause one or more computer systems to perform according to the teachings herein.

The operation of the computer unit 1002 can be controlled by a variety of different program modules. Examples of program modules are routines, programs, objects, components, data structures, libraries, etc. that perform particular tasks or implement particular abstract data types. The example embodiments may also be practiced with other computer system configurations, including handheld devices, multiprocessor systems, microprocessor-based or programmable consumer electronics, network PCs, minicomputers, mainframe computers, personal digital assistants, mobile telephones e.g. smartphones and the like. Furthermore, the example embodiments may also be practiced in distributed computing environments where tasks are performed by remote processing devices that are linked through a wireless or wired communications network. In a distributed computing environment, program modules may be in both local and remote memory storage devices.

It will be appreciated by a person skilled in the art that other variations and/or modifications may be made to the specific embodiments without departing from the scope of the invention as broadly described. For example, in the description herein, features of different exemplary embodiments may be mixed, combined, interchanged, incorporated, adopted, modified, included etc. or the like across different exemplary embodiments. The present embodiments are, therefore, to be considered in all respects to be illustrative and not restrictive.

The invention claimed is:

1. A method of detecting winding fault during online operation of an electrical machine, said method comprising,
    acquiring a set of signals from the electrical machine over a period, said set of signals comprising two or more magnetic flux signals, each of said magnetic flux signals obtained from a respective flux sensor positioned on an external surface of the electrical machine;
    extracting an internal winding fault indicator from the set of signals;
    comparing the internal winding fault indicator with a baseline indicator;
    determining an internal winding fault when the internal winding fault indicator deviates from the baseline indicator by a threshold; and
    further comprising detecting an external fault prior to the step of extracting the internal fault indicator.

2. The method of claim 1, wherein the electrical machine is a transformer comprising a magnetic core, said magnetic core comprising,
    a centre limb, a first outer limb positioned on one side of the centre limb and a second outer limb positioned on another opposite side of the centre limb, wherein the three limbs are spaced apart and arranged substantially parallel to one another, each limb having a primary winding and a secondary winding;
    a top yoke member connected to a respective first end of the centre, first and second outer limbs,
    a bottom yoke member connected to a respective second end of the centre, first and second outer limbs;
    the method further comprising energising the transformer, prior to the acquiring of the set of signals;
    wherein energising the transformer comprises passing a varying electric current through the primary winding to produce varying magnetic fluxes, said varying magnetic fluxes capable of inducing an electro motive force in the secondary winding.

3. The method of claim 2, wherein
    acquiring the set of signals from the transformer over a period comprises acquiring a first flux signal and a second flux signal,
    wherein the first flux signal is acquired from a first flux sensor positioned proximate the first outer limb and the second flux signal is acquired from a second flux sensor positioned proximate the second outer limb.

4. The method of claim 3, wherein extracting the internal winding fault indicator comprises
    acquiring a line-voltage signal of the transformer;
    summing the first and second flux signals to obtain a total flux signal;
    obtaining the difference between the phase angle of the line-voltage of the transformer and the phase angle of the total flux signal, as the internal winding fault indicator;
    or obtaining a combination of (i) the difference between the phase angle of the line-voltage of the transformer and the phase angle of the total flux signal and (ii) a magnitude value of the total flux signal, as the internal winding fault indicator.

5. The method of claim 4, wherein the threshold is 110%, 115%, 120%, 125%, 130%, 135%, 140%, 145%, 150%, or 155% of the phase angles obtained during initial calibration, wherein the initial calibration comprises obtaining a trend of a baseline internal fault indicator from the step of energising the transformer until a steady state is reached.

6. The method of claim 5, wherein detecting the external fault comprises
    extracting an external fault indicator by
        obtaining a first difference between phase angles of the line-voltage of the transformer and the first flux signal; and
        obtaining a second difference between phase angles of the line-voltage of the transformer and the second flux signal;
    wherein the external fault indicator is the absolute value of a difference between the first difference and second difference; and
    detecting the external fault in the transformer when the external fault indicator is within a faulty range;
    wherein the faulty range is a phase angle value which is more than 0° and less than 90°.

7. The method of claim 6, further comprising detecting an inrush current condition to the transformer prior to detecting the external fault in the transformer, wherein detecting the inrush current condition comprises
    extracting respective first and second magnitude values of second harmonic components of the first and second flux signals;
    comparing magnitude values of first and second flux signals against respective acceptable magnitude values; and detecting the inrush current condition if the magnitude values of a core-leakage/-linkage flux signals at the first and second outer limbs are greater than the respective acceptable magnitude values, wherein the acceptable magnitude values are not more than 140%, not more than 145% or not more than 150% of the magnitudes obtained during initial calibration, wherein the initial calibration further comprises obtaining a trend of first and second magnitude values of baseline second harmonic components of the first and second flux signals from the step of energising the transformer until a steady state is reached.

8. The method of claim 7, further comprising re-acquiring a new set of signals from the transformer when the inrush current condition is detected.

9. The method of claim 1, wherein the electrical machine is a motor or generator comprising,
a stator having a cylindrical frame, the cylindrical frame comprising a plurality of electrically conductive windings arranged therein;
a rotor having a cylindrical body concentrically mounted and rotatable within the cylindrical frame of the stator, said rotor having a drive end and a non-drive end; and
an elongated shaft member coaxially mounted to the rotor, said shaft member protruding from the rotor at the drive end;
the method further comprising energising the motor or generator, prior to the acquiring of the set of signals;
wherein energising the motor comprises passing a varying electric current through the windings of the stator to produce varying magnetic fluxes, said varying magnetic fluxes capable of inducing the rotor and shaft member to rotate about the respective longitudinal axis of the rotor and shaft member; and
wherein energising the generator comprises driving the rotor and shaft member of the generator to rotate about the respective longitudinal axis of the rotor and shaft member to produce varying magnetic fluxes linked with the windings of the stator, said varying magnetic fluxes capable of inducing an electro motive force in the windings of the stator.

10. The method of claim 9, wherein
acquiring the set of signals from the motor or generator over a period comprises acquiring a set of P flux signals from P flux sensors positioned proximate the stator along the circumference of the cylindrical frame of the stator, such that any two adjacent flux sensors along the circumference of the cylindrical frame has an angular separation of $$\frac{360}{P}$$

degrees with respect to the longitudinal axis of the cylindrical frame, wherein P represents the total number of poles of the motor or generator.

11. The method of claim 10, wherein extracting the internal winding fault indicator comprises
summing the set of P flux signals to obtain a total flux signal; and
performing a Fourier transform on the total flux signal to obtain a magnitude of the total flux signal as the internal winding fault indicator.

12. The method of claim 11, wherein the threshold is 120%, 130%, or 140% of the magnitude of a baseline fault indicator obtained during initial calibration when the motor or generator is under steady state, wherein the baseline fault indicator is obtained by summing a set of P baseline flux signals to obtain a total baseline flux signal and obtaining the magnitude of the total baseline flux signal.

13. The method of claim 10, wherein detecting the external fault comprises
performing a Fourier transform on each of the P flux signals to obtain respective magnitudes of the P flux signals;
summing the respective magnitudes of the P flux signals to obtain a summed value as an external fault indicator; and
detecting the external fault in the motor or generator when the summed value is within acceptable threshold;
wherein the acceptable threshold is 90%, 85%, or 80% of a baseline load indicator of a lowest loading condition, said baseline load indicator obtained during initial calibration when the motor or generator is under steady state, wherein the baseline load indicator is obtained based on a sum of the respective magnitudes of the P flux signals, or either one of a phase current magnitude or line-current magnitude of the motor or generator.

14. The method of claim 13, wherein prior to the detecting an external fault, the method comprises identifying a loading condition by
comparing the summed magnitudes of P flux signals or phase-current magnitude or line-current magnitude with corresponding pre-calibrated values.

15. The method of claim 1, further comprising triggering a trip signal when the internal winding fault is detected.

16. The method of claim 1, wherein the two or more flux sensors are either Hall-effect based flux sensors or passive coils.

17. The method of claim 1, further comprising acquiring flux signals for at least one fundamental cycle of the flux signals.

18. A system for detecting winding fault during online operation of an electrical machine, said system comprising,
a power supply unit,
a receiver unit for receiving a set of signals acquired from the electrical machine over a period, said set of signals comprising two or more magnetic flux signals, each of said magnetic flux signals obtained from a respective flux sensor positioned on an external surface of the electrical machine;
a signal pre-processing unit for pre-processing the set of signals; and
a DSP or FPGA or microcontroller or microprocessor for extracting an internal winding fault indicator from the set of signals, comparing the internal winding fault indicator with a baseline indicator, determining an internal winding fault when the internal winding fault indicator deviates from the baseline indicator by a threshold, and detecting an external fault prior to the step of extracting the internal fault indicator.

19. A non-transitory computer readable storage medium having stored thereon instructions for instructing a processing unit of a system to execute a method of detecting winding fault during online operation of an electrical machine, said method comprising,
Acquiring a set of signals from the electrical machine over a period, said set of signals comprising two or more magnetic flux signals, each of said magnetic flux signals obtained from a respective flux sensor positioned on an external surface of the electrical machine;

extracting an internal winding fault indicator from the set of signals;

comparing the internal winding fault indicator with a baseline indicator;

determining an internal winding fault when the internal winding fault indicator deviates from the baseline indicator by a threshold; and detecting an external fault prior to the step of extracting the internal fault indicator.

\* \* \* \* \*